(12) United States Patent
Chaichanavong et al.

(10) Patent No.: US 7,612,697 B1
(45) Date of Patent: *Nov. 3, 2009

(54) RATE-28/30 DC-FREE RLL CODE

(75) Inventors: Panu Chaichanavong, Mountain View, CA (US); Zining Wu, Los Altos, CA (US)

(73) Assignee: Marvell International Ltd, Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/287,763

(22) Filed: Oct. 13, 2008

Related U.S. Application Data

(63) Continuation of application No. 11/657,492, filed on Jan. 24, 2007, now Pat. No. 7,436,331.

(60) Provisional application No. 60/791,581, filed on Apr. 12, 2006, provisional application No. 60/796,850, filed on May 2, 2006.

(51) Int. Cl.
*H03M 7/00* (2006.01)

(52) U.S. Cl. .............. 341/59; 341/58; 341/68; 341/69; 341/94

(58) Field of Classification Search .......... 341/58, 341/59, 68–69, 94
See application file for complete search history.

(56) References Cited

U.S. PATENT DOCUMENTS

| 2,957,947 | A |   | 10/1960 | Bowers |
|---|---|---|---|---|
| 3,405,235 | A |   | 10/1968 | Carter |
| 5,933,103 | A | * | 8/1999 | Kim ............... 341/59 |
| 6,617,985 | B1 |   | 9/2003 | Poeppelman |
| 7,174,485 | B2 |   | 2/2007 | Silvus |
| 7,301,482 | B1 |   | 11/2007 | Oberg |

OTHER PUBLICATIONS

"K.A.S. Immink—Codes for Mars Data Storage Systesm"—pp. 101-103; and 185-200.
"K.A.S. Immink—Codes for Mars Data Storage Systems"—pp. 221-223.
USPTO Non-Final Office Action mailed Jan. 17, 2008 U.S. Appl. No. 11/657,492, filed Jan. 24, 2007.
Amendment filed May 15, 2008 in response to USPTO Non-Final Office Action mailed Jan. 17, 2008 for U.S. Appl. No. 11/657,492, filed Jan. 24, 2007.

* cited by examiner

*Primary Examiner*—Khai M Nguyen

(57) ABSTRACT

A run-length limited (RLL) encoder includes a block detection module that receives a data block that includes N portions and generates N−1 coding bits indicating whether corresponding ones of N−1 of the N portions of the data block include one of all ones and all zeros, where N is an integer greater than two. A mapping module generates an RLL codeword including N portions comprising bits that are determined by a first mapping table, a second mapping table, bits of the data block and the N−1 coding bits.

18 Claims, 18 Drawing Sheets

| | $x_1 \ldots x_{14}$ | $\bar{x}_{14}$ | $x_{15} \ldots x_{28}$ |
|---|---|---|---|

| $L_1 L_2 R_2 R_1$ | $y_{12}$ | $y_{13}$ | $y_{14} y_{15} y_{16}$ | $y_{17}$ | $y_{18}$ | $B$ |
|---|---|---|---|---|---|---|
| 0000 | $x_{12}$ | $x_{13}$ | $x_{14} \bar{x}_{14} x_{15}$ | $x_{16}$ | $x_{17}$ | 0 |
| 1000 | $x_{12}$ | 1 | 110 | $x_{16}$ | $x_{17}$ | 0 |
| 0001 | $x_{12}$ | 0 | 110 | $x_{16}$ | $x_{17}$ | 0 |
| 0100 | $x_{12}$ | 1 | 001 | 0 | $x_{17}$ | 0 |
| 0010 | $x_{12}$ | 0 | 001 | 0 | $x_{17}$ | 0 |
| 1100 | $x_{12}$ | 1 | 001 | 1 | $x_{17}$ | 0 |
| 0011 | $x_{12}$ | 0 | 001 | 1 | $x_{17}$ | 0 |
| otherwise | $L_1$ | $L_2$ | 000 | $R_2$ | $R_1$ | 1 |

FIG. 5

| $L_1$ | $B$ |  |
|---|---|---|
| 1 | 0 | $y_1 y_2 y_3 y_4 y_5$ |
| 1 | 1 | $x_{13} x_{14} x_3 \bar{x}_3 x_{15}$ |
| 0 | 0,1 | $x_{13} x_{14} x_3 \bar{x}_3 x_{12}$ |
|   |   | $x_1 x_2 x_3 x_4 x_5$ |

| $L_2$ | $B$ |  |
|---|---|---|
| 1 | 0 | $y_6 y_7 y_8 y_9 y_{10} y_{11}$ |
| 1 | 1 | $x_{13} x_{14} x_8 \bar{x}_8 x_{15} x_{16}$ |
| 0 | 0,1 | $x_{13} x_{14} x_8 \bar{x}_8 x_{12} x_{16}$ |
|   |   | $x_6 x_7 x_8 x_9 x_{10} x_{11}$ |

| $R_2$ | $B$ |  |
|---|---|---|
| 1 | 0 | $y_{19} y_{20} y_{21} y_{22} y_{23} y_{24}$ |
| 1 | 1 | $x_{16} x_{15} \bar{x}_{21} x_{21} x_{14} x_{13}$ |
| 0 | 0,1 | $x_{16} x_{15} \bar{x}_{21} x_{21} x_{17} x_{13}$ |
|   |   | $x_{18} x_{19} x_{20} x_{21} x_{22} x_{23}$ |

| $R_1$ | $B$ |  |
|---|---|---|
| 1 | 0 | $y_{25} y_{26} y_{27} y_{28} y_{29}$ |
| 1 | 1 | $x_{15} \bar{x}_{26} x_{26} x_{14} x_{13}$ |
| 0 | 0,1 | $x_{15} \bar{x}_{26} x_{26} x_{16} x_{17}$ |
|   |   | $x_{24} x_{25} x_{26} x_{27} x_{28}$ |

$$L_1 = x_1 \cdot x_2 \cdot x_3 \cdot x_4 \cdot x_5 + \overline{x_1 + x_2 + x_3 + x_4 + x_5}$$
$$L_2 = x_6 \cdot x_7 \cdot x_8 \cdot x_9 \cdot x_{10} \cdot x_{11} + \overline{x_6 + x_7 + x_8 + x_9 + x_{10} + x_{11}}$$
$$R_2 = x_{18} \cdot x_{19} \cdot x_{20} \cdot x_{21} \cdot x_{22} \cdot x_{23} + \overline{x_{18} + x_{19} + x_{20} + x_{21} + x_{22} + x_{23}}$$
$$R_1 = x_{24} \cdot x_{25} \cdot x_{26} \cdot x_{27} \cdot x_{28} + \overline{x_{24} + x_{25} + x_{26} + x_{27} + x_{28}}$$

$$A = L_1 + L_2 + R_2 + R_1$$
$$B = (L_1 + L_2) \cdot (R_2 + R_1)$$
$$S = \bar{L}_2 \cdot \bar{R}_2 \cdot \overline{L_1 \cdot R_1}$$

FIG. 9A

$$y_1 = L_1 \cdot x_{13} + \bar{L}_1 \cdot x_1$$
$$y_2 = L_1 \cdot x_{14} + \bar{L}_1 \cdot x_2$$
$$y_3 = x_3$$
$$y_4 = L_1 \cdot \bar{x}_3 + \bar{L}_1 \cdot x_4$$
$$y_5 = L_1 \cdot (B \cdot x_{12} + \bar{B} \cdot x_{15}) + \bar{L}_1 \cdot x_5$$

$$y_6 = L_2 \cdot x_{13} + \bar{L}_2 \cdot x_6$$
$$y_7 = L_2 \cdot x_{14} + \bar{L}_2 \cdot x_7$$
$$y_8 = x_8$$
$$y_9 = L_2 \cdot \bar{x}_8 + \bar{L}_2 \cdot x_9$$
$$y_{10} = L_2 \cdot (B \cdot x_{12} + \bar{B} \cdot x_{15}) + \bar{L}_2 \cdot x_{10}$$
$$y_{11} = L_2 \cdot x_{16} + \bar{L}_2 \cdot x_{11}$$

$$y_{12} = B \cdot L_1 + \bar{B} \cdot x_{12}$$
$$y_{13} = B \cdot L_2 + \bar{A} \cdot x_{13} + A \cdot \bar{B} \cdot (L_1 + L_2)$$
$$y_{14} = \bar{A} \cdot x_{14} + A \cdot S$$
$$y_{15} = \bar{A} \cdot \bar{x}_{14} + A \cdot S$$
$$y_{16} = \bar{A} \cdot x_{15} + \bar{S} \cdot \bar{B}$$
$$y_{17} = S \cdot x_{16} + \bar{S} \cdot \bar{B} \cdot (L_1 \cdot L_2 + R_2 \cdot R_1) + B \cdot R_2$$
$$y_{18} = B \cdot R_1 + \bar{B} \cdot x_{17}$$

$$y_{19} = R_2 \cdot x_{16} + \bar{R}_2 \cdot x_{18}$$
$$y_{20} = R_2 \cdot x_{15} + \bar{R}_2 \cdot x_{19}$$
$$y_{21} = R_2 \cdot \bar{x}_{21} + \bar{R}_2 \cdot x_{20}$$
$$y_{22} = x_{21}$$
$$y_{23} = R_2 \cdot (B \cdot x_{17} + \bar{B} \cdot x_{14}) + \bar{R}_2 \cdot x_{22}$$
$$y_{24} = R_2 \cdot x_{13} + \bar{R}_2 \cdot x_{23}$$

$$y_{25} = R_1 \cdot x_{15} + \bar{R}_1 \cdot x_{24}$$
$$y_{26} = R_1 \cdot \bar{x}_{26} + \bar{R}_1 \cdot x_{25}$$
$$y_{27} = x_{26}$$
$$y_{28} = R_1 \cdot (B \cdot x_{16} + \bar{B} \cdot x_{14}) + \bar{R}_1 \cdot x_{27}$$
$$y_{29} = R_1 \cdot (B \cdot x_{17} + \bar{B} \cdot x_{13}) + \bar{R}_1 \cdot x_{28}$$

FIG. 9B

$$L_1 = B \cdot \hat{y}_{12} + E + G \cdot \hat{y}_{17}$$

$$L_2 = B \cdot \hat{y}_{13} + G$$

$$R_2 = B \cdot \hat{y}_{17} + H$$

$$R_1 = B \cdot \hat{y}_{18} + F + H \cdot \hat{y}_{17}$$

$$A = \overline{\hat{y}_{14} \oplus \hat{y}_{15}}$$

$$B = \overline{\hat{y}_{14} + \hat{y}_{15} + \hat{y}_{16}}$$

$$E = \hat{y}_{13} \cdot \hat{y}_{14} \cdot \hat{y}_{15} \cdot \hat{y}_{16}$$

$$F = \hat{y}_{13} \cdot \hat{y}_{14} \cdot \hat{y}_{15} \cdot \hat{y}_{16}$$

$$G = \hat{y}_{13} \cdot \hat{y}_{14} \cdot \hat{y}_{15} \cdot \hat{y}_{16}$$

$$H = \hat{y}_{13} \cdot \hat{y}_{14} \cdot \hat{y}_{15} \cdot \hat{y}_{16}$$

$$J = B \cdot \hat{y}_{13}$$

$$K = B \cdot \hat{y}_{17}$$

FIG. 10A

$$\hat{x}_1 = L_1 \cdot \hat{y}_3 + \bar{L}_1 \cdot \hat{y}_1$$
$$\hat{x}_2 = L_1 \cdot \hat{y}_3 + \bar{L}_1 \cdot \hat{y}_2$$
$$\hat{x}_3 = \hat{y}_3$$
$$\hat{x}_4 = L_1 \cdot \hat{y}_3 + \bar{L}_1 \cdot \hat{y}_4$$
$$\hat{x}_5 = L_1 \cdot \hat{y}_3 + \bar{L}_1 \cdot \hat{y}_5$$

$$\hat{x}_6 = L_2 \cdot \hat{y}_8 + \bar{L}_2 \cdot \hat{y}_6$$
$$\hat{x}_7 = L_2 \cdot \hat{y}_8 + \bar{L}_2 \cdot \hat{y}_7$$
$$\hat{x}_8 = \hat{y}_8$$
$$\hat{x}_9 = L_2 \cdot \hat{y}_8 + \bar{L}_2 \cdot \hat{y}_9$$
$$\hat{x}_{10} = L_2 \cdot \hat{y}_8 + \bar{L}_2 \cdot \hat{y}_{10}$$
$$\hat{x}_{11} = L_2 \cdot \hat{y}_8 + \bar{L}_2 \cdot \hat{y}_{11}$$

$$\hat{x}_{12} = B \cdot (J \cdot \hat{y}_{10} + \bar{J} \cdot \hat{y}_5) + \bar{B} \cdot \hat{y}_{12}$$
$$\hat{x}_{13} = B \cdot (J \cdot \hat{y}_6 + \bar{J} \cdot \hat{y}_1) + E \cdot \hat{y}_1 + F \cdot \hat{y}_{29} + G \cdot \hat{y}_6 + H \cdot \hat{y}_{24} + \bar{A} \cdot \hat{y}_{13}$$
$$\hat{x}_{14} = B \cdot (J \cdot \hat{y}_7 + \bar{J} \cdot \hat{y}_2) + E \cdot \hat{y}_2 + F \cdot \hat{y}_{28} + G \cdot \hat{y}_7 + H \cdot \hat{y}_{23} + \bar{A} \cdot \hat{y}_{14}$$
$$\hat{x}_{15} = B \cdot (K \cdot \hat{y}_{20} + \bar{K} \cdot \hat{y}_{25}) + E \cdot \hat{y}_5 + F \cdot \hat{y}_{25} + G \cdot \hat{y}_{10} + H \cdot \hat{y}_{20} + \bar{A} \cdot \hat{y}_{16}$$
$$\hat{x}_{16} = B \cdot (K \cdot \hat{y}_{19} + \bar{K} \cdot \hat{y}_{28}) + E \cdot \hat{y}_{17} + F \cdot \hat{y}_{17} + G \cdot \hat{y}_{11} + H \cdot \hat{y}_{19} + \bar{A} \cdot \hat{y}_{17}$$
$$\hat{x}_{17} = B \cdot (K \cdot \hat{y}_{23} + \bar{K} \cdot \hat{y}_{29}) + \bar{B} \cdot \hat{y}_{18}$$

$$\hat{x}_{18} = R_2 \cdot \hat{y}_{22} + \bar{R}_2 \cdot \hat{y}_{19}$$
$$\hat{x}_{19} = R_2 \cdot \hat{y}_{22} + \bar{R}_2 \cdot \hat{y}_{20}$$
$$\hat{x}_{20} = R_2 \cdot \hat{y}_{22} + \bar{R}_2 \cdot \hat{y}_{21}$$
$$\hat{x}_{21} = \hat{y}_{22}$$
$$\hat{x}_{22} = R_2 \cdot \hat{y}_{22} + \bar{R}_2 \cdot \hat{y}_{23}$$
$$\hat{x}_{23} = R_2 \cdot \hat{y}_{22} + \bar{R}_2 \cdot \hat{y}_{24}$$

$$\hat{x}_{24} = R_1 \cdot \hat{y}_{27} + \bar{R}_1 \cdot \hat{y}_{25}$$
$$\hat{x}_{25} = R_1 \cdot \hat{y}_{27} + \bar{R}_1 \cdot \hat{y}_{26}$$
$$\hat{x}_{26} = \hat{y}_{27}$$
$$\hat{x}_{27} = R_1 \cdot \hat{y}_{27} + \bar{R}_1 \cdot \hat{y}_{28}$$
$$\hat{x}_{28} = R_1 \cdot \hat{y}_{27} + \bar{R}_1 \cdot \hat{y}_{29}$$

FIG. 10B

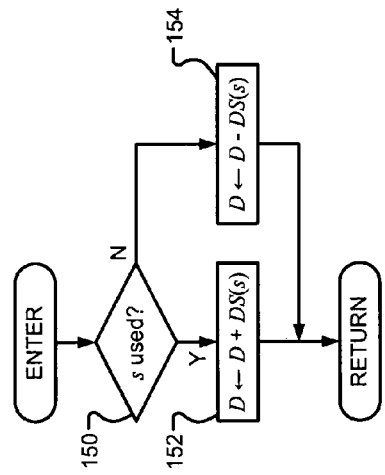
FIG. 11B
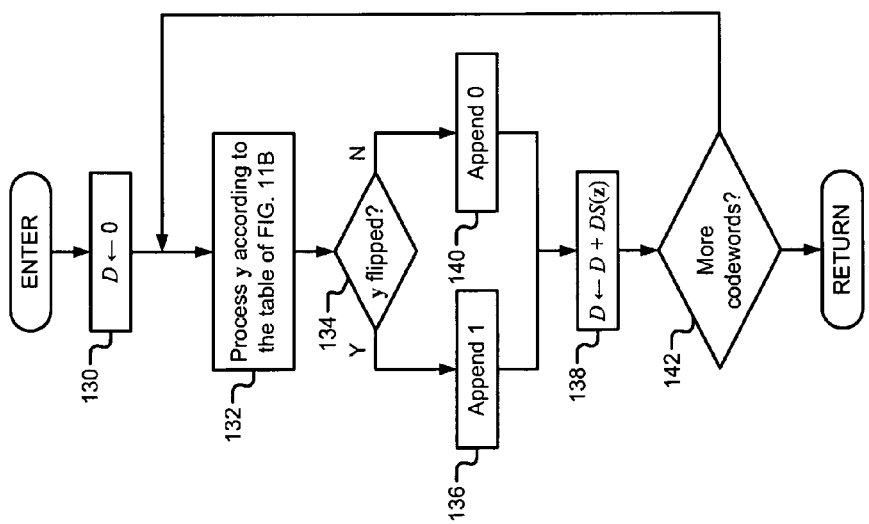
FIG. 12
FIG. 11A

RATE-28/30 DC-FREE RLL CODE

CROSS-REFERENCE TO RELATED APPLICATIONS

This application is a continuation of U.S. patent application Ser. No. 11/657,492, now U.S. Pat. No. 7,436,331 filed Jan. 24, 2007, which claims the benefit of U.S. Provisional Applications Nos. 60/791,581, filed Apr. 12, 2006 and 60/796,850, filed May 2, 2006. The disclosures of the above applications are incorporated herein by reference in their entirety.

FIELD

The present disclosure relates to networks, and more particularly to data coding in physical coding sublayers of physical layer devices in network devices.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a layered network model 10 is shown. Network model 10 includes a physical layer 12 that transmits and receives data over a communication channel 14. Examples of channel 14 include copper lines, fiber optic links, wireless links, and the like. Physical layer 12 can include an isolation sublayer 16; such as a transformer that isolates DC signals in channel 14 from other sublayers of physical layer 12. The isolation sublayer 16 may pose limitations to the bandwidth through physical layer 12. An amplification sublayer 18 amplifies signals that are received from channel 14 and amplifies signals that are transmitted onto channel 14. A filtering sublayer 20 communicates with amplification sublayer 18 and isolates signals of interest from noise and/or other signals that may appear on channel 14. An analog to digital conversion sublayer 22 converts data between a digital format that is employed by the other layers of network model 10 and an analog format that is employed by channel 14.

SUMMARY

A run-length limited (RLL) encoder includes a problematic-block detection module that receives a data block and that generates coding bits that indicate whether at least one of N portions of the data block include one of all ones and all zeros, where N is an integer greater than one. A mapping module generates an RLL codeword based on the data block and the coding bits. The RLL codeword includes N portions. One of the N portions of the RLL codeword is populated with the coding bits. At least another one of the remaining portions of the RLL codeword is populated with at least part of the data from one of the N portions of the data block that corresponds with the one of the N portions of the RLL codeword.

In other features the RLL codeword is encoded in a non-return to zero (NRZ) format. Each portion of the RLL codeword includes at least one transition. The one of the N portions of the RLL codeword includes an additional bit as compared to the one of the N portions of the data block that corresponds with the one of the N portions of the RLL codeword. The N portions of the RLL codeword include first and fifth portions that each include five bits, second and fourth portions that each include six bits, and a third portion that includes seven bits. The third portion is the one of the N portions of the RLL codeword. The data block includes 28 bits. The first through fifth portions are consecutive, the first portion includes least significant bits of the RLL codeword, the fifth portion includes most significant bits of the RLL codeword, and the third portion includes a middle seven bits of the RLL codeword.

In other features the RLL encoder includes a DC-free encoder module that generates DC-free codewords based on the RLL codewords. A network physical layer module (PHY) includes the RLL encoder and further includes a DC-free encoder module that generates DC-free codewords based on the RLL codewords. The DC-free encoder module generates each DC-free codeword based on a corresponding one of the RLL codewords and a cumulative digital sum of previously-generated DC-free codewords. The DC-free encoder generates each DC-free codeword based on a digital sum of a corresponding one of the RLL codewords, a cumulative digital sum of previously-generated DC-free codewords, and an appended bit. The appended bit indicates whether remaining bits of the DC-free codeword are inverted from their corresponding bits of the RLL codeword.

A run-length limited (RLL) receiver includes a problematic-block decoding module that receives a predetermined portion of an RLL codeword that includes a plurality of portions. The problematic-block decoding module generates coding bits based on the predetermined portion and the coding bits indicate whether corresponding portions of the RLL codeword decode to one of all ones and all zeros. A mapping module generates a decoded data block based on the RLL codeword and the coding bits. Portions of the decoded data block correlate with portions of the RLL codeword and at least one of the portions of the RLL codeword is populated with the bits of the portion of the data block that corresponds with the predetermined portion of the RLL codeword.

In other features the RLL codeword is encoded in a non-return to zero (NRZ) format. Each portion of the RLL codeword includes at least one transition. The predetermined portion of the RLL codeword includes an additional bit when compared to a number of bits in the corresponding portion of the received data block. The plurality of portions of the RLL codeword includes first and fifth portions that each include five bits, second and fourth portions that each include six bits, and a third portion that includes seven bits. The third portion is the predetermined portion of the RLL codeword. The received data block includes 28 bits. The first through fifth portions are consecutive, the first portion includes least significant bits of the RLL codeword, and fifth portion includes most significant bits of the RLL codeword, and the third portion includes middle bits of the RLL codeword.

In other features the RLL receiver further includes a DC-free decoder module that generates the RLL codewords based on received codewords. A network physical layer module (PHY) includes the RLL receiver and further includes a DC-free decoder module that generates the RLL codewords based on received codewords. The DC-free decoder module monitors a predetermined bit in the received codewords and generates the corresponding RLL codewords by selectively inverting bits of the received codewords based on the predetermined bit. Consecutive ones of the received codewords include respective portions of a predetermined sync word. The DC-free decoder module synchronizes with the received codewords based on the sync word. The DC-free encoder module XORs consecutive bits of the received codewords to locate the sync word.

A method of operating a run-length limited (RLL) encoder includes receiving a data block, generating coding bits that indicate whether at least one of N portions of the data block include one of all ones and all zeros, where N is an integer greater than one, and generating an RLL codeword based on the data block and the coding bits. The RLL codeword includes N portions. One of the N portions of the RLL codeword is populated with the coding bits. At least another one of the remaining portions of the RLL codeword is populated with at least part of the data from one of the N portions of the data block that corresponds with the one of the N portions of the RLL codeword.

In other features the RLL codeword is encoded in a non-return to zero (NRZ) format. Each portion of the RLL codeword includes at least one transition. The one of the N portions of the RLL codeword includes an additional bit as compared to the one of the N portions of the data block that corresponds with the one of the N portions of the RLL codeword. The N portions of the RLL codeword include first and fifth portions that each include five bits, second and fourth portions that each include six bits, and a third portion that includes seven bits. The third portion is the one of the N portions of the RLL codeword. The data block includes 28 bits. The first through fifth portions are consecutive, the first portion includes least significant bits of the RLL codeword, the fifth portion includes most significant bits of the RLL codeword, and the third portion includes a middle seven bits of the RLL codeword.

In other features the method further includes generating DC-free codewords based on the RLL codewords. A method of operating a network physical layer module (PHY) includes the method and further includes generating DC-free codewords based on the RLL codewords. The method further includes generating each DC-free codeword based on a corresponding one of the RLL codewords and a cumulative digital sum of previously-generated DC-free codewords. The method further includes generating each DC-free codeword based on a digital sum of a corresponding one of the RLL codewords, a cumulative digital sum of previously-generated DC-free codewords, and an appended bit. The appended bit indicates whether remaining bits of the DC-free codeword are inverted from their corresponding bits of the RLL codeword.

A method of operating a run-length limited (RLL) receiver includes receiving a predetermined portion of an RLL codeword that includes a plurality of portions and generating coding bits based on the predetermined portion. The coding bits indicate whether corresponding portions of the RLL codeword decode to one of all ones and all zeros. The method also includes generating a decoded data block based on the RLL codeword and the coding bits. Portions of the decoded data block correlate with portions of the RLL codeword and at least one of the portions of the RLL codeword is populated with the bits of the portion of the data block that corresponds with the predetermined portion of the RLL codeword.

In other features the RLL codeword is encoded in a non-return to zero (NRZ) format. Each portion of the RLL codeword includes at least one transition. The predetermined portion of the RLL codeword includes an additional bit when compared to a number of bits in the corresponding portion of the received data block. The plurality of portions of the RLL codeword includes first and fifth portions that each include five bits, second and fourth portions that each include six bits, and a third portion that includes seven bits. The third portion is the predetermined portion of the RLL codeword. The received data block includes 28 bits. The first through fifth portions are consecutive, the first portion includes least significant bits of the RLL codeword, and fifth portion includes most significant bits of the RLL codeword, and the third portion includes middle bits of the RLL codeword.

In other features the method further includes generating the RLL codewords based on received codewords. A method of operating a network physical layer module (PHY) includes the method and further includes generating the RLL codewords based on received codewords. The method further includes monitoring a predetermined bit in the received codewords and generating the corresponding RLL codewords by selectively inverting bits of the received codewords based on the predetermined bit. Consecutive ones of the received codewords include respective portions of a predetermined sync word. The method includes synchronizing with the received codewords based on the sync word. The method includes XORing consecutive bits of the received codewords to locate the sync word.

A run-length limited (RLL) encoder includes problematic-block detection means for receiving a data block and that generating coding bits that indicate whether at least one of N portions of the data block include one of all ones and all zeros, where N is an integer greater than one. Mapping means generate an RLL codeword based on the data block and the coding bits. The RLL codeword includes N portions. One of the N portions of the RLL codeword is populated with the coding bits. At least another one of the remaining portions of the RLL codeword is populated with at least part of the data from one of the N portions of the data block that corresponds with the one of the N portions of the RLL codeword.

In other features the RLL codeword is encoded in a non-return to zero (NRZ) format. Each portion of the RLL codeword includes at least one transition. The one of the N portions of the RLL codeword includes an additional bit as compared to the one of the N portions of the data block that corresponds with the one of the N portions of the RLL codeword. The N portions of the RLL codeword include first and fifth portions that each include five bits, second and fourth portions that each include six bits, and a third portion that includes seven bits. The third portion is the one of the N portions of the RLL codeword. The data block includes 28 bits. The first through fifth portions are consecutive, the first portion includes least significant bits of the RLL codeword, the fifth portion includes most significant bits of the RLL codeword, and the third portion includes a middle seven bits of the RLL codeword.

In other features the RLL encoder includes DC-free encoder means for generating DC-free codewords based on the RLL codewords. A network physical layer module (PHY) includes the RLL encoder and further includes DC-free encoder means for generating DC-free codewords based on the RLL codewords. The DC-free encoder means generates each DC-free codeword based on a corresponding one of the RLL codewords and a cumulative digital sum of previously-generated DC-free codewords. The DC-free encoder means generates each DC-free codeword based on a digital sum of a corresponding one of the RLL codewords, a cumulative digital sum of previously-generated DC-free codewords, and an appended bit. The appended bit indicates whether remaining bits of the DC-free codeword are inverted from their corresponding bits of the RLL codeword.

A run-length limited (RLL) receiver includes problematic-block decoding means for receiving a predetermined portion of an RLL codeword that includes a plurality of portions. The problematic-block decoding means generates coding bits based on the predetermined portion and the coding bits indicate whether corresponding portions of the RLL codeword decode to one of all ones and all zeros. Mapping means generate a decoded data block based on the RLL codeword and the coding bits. Portions of the decoded data block correlate with portions of the RLL codeword and at least one of the portions of the RLL codeword is populated with the bits of the portion of the data block that corresponds with the predetermined portion of the RLL codeword.

In other features the RLL codeword is encoded in a non-return to zero (NRZ) format. Each portion of the RLL codeword includes at least one transition. The predetermined portion of the RLL codeword includes an additional bit when compared to a number of bits in the corresponding portion of the received data block. The plurality of portions of the RLL codeword includes first and fifth portions that each include five bits, second and fourth portions that each include six bits, and a third portion that includes seven bits. The third portion is the predetermined portion of the RLL codeword. The received data block includes 28 bits. The first through fifth portions are consecutive, the first portion includes least significant bits of the RLL codeword, and fifth portion includes most significant bits of the RLL codeword, and the third portion includes middle bits of the RLL codeword.

In other features the RLL receiver includes DC-free decoder means for generating the RLL codewords based on received codewords. A network physical layer module (PHY) includes the RLL receiver and further includes DC-free decoder means for generating the RLL codewords based on received codewords. The DC-free decoder means monitors a predetermined bit in the received codewords and generates the corresponding RLL codewords by selectively inverting bits of the received codewords based on the predetermined bit. Consecutive ones of the received codewords include respective portions of a predetermined sync word and wherein the DC-free decoder module synchronizes with the received codewords based on the sync word. The DC-free encoder means XORs consecutive bits of the received codewords to locate the sync word.

A computer program for operating a run-length limited (RLL) encoder is executed by one or more processors. The computer program can reside on a computer readable medium such as but not limited to memory, non-volatile data storage and/or other suitable tangible storage mediums. The computer program includes receiving a data block, generating coding bits that indicate whether at least one of N portions of the data block include one of all ones and all zeros, where N is an integer greater than one, and generating an RLL codeword based on the data block and the coding bits. The RLL codeword includes N portions. One of the N portions of the RLL codeword is populated with the coding bits. At least another one of the remaining portions of the RLL codeword is populated with at least part of the data from one of the N portions of the data block that corresponds with the one of the N portions of the RLL codeword.

In other features the RLL codeword is encoded in a non-return to zero (NRZ) format. Each portion of the RLL codeword includes at least one transition. The one of the N portions of the RLL codeword includes an additional bit as compared to the one of the N portions of the data block that corresponds with the one of the N portions of the RLL codeword. The N portions of the RLL codeword include first and fifth portions that each include five bits, second and fourth portions that each include six bits, and a third portion that includes seven bits. The third portion is the one of the N portions of the RLL codeword. The data block includes 28 bits. The first through fifth portions are consecutive, the first portion includes least significant bits of the RLL codeword, the fifth portion includes most significant bits of the RLL codeword, and the third portion includes a middle seven bits of the RLL codeword.

In other features the computer program further includes generating DC-free codewords based on the RLL codewords. A computer program for operating a network physical layer module (PHY) includes the computer program and further includes generating DC-free codewords based on the RLL codewords. The computer program further includes generating each DC-free codeword based on a corresponding one of the RLL codewords and a cumulative digital sum of previously-generated DC-free codewords. The computer program further includes generating each DC-free codeword based on a digital sum of a corresponding one of the RLL codewords, a cumulative digital sum of previously-generated DC-free codewords, and an appended bit. The appended bit indicates whether remaining bits of the DC-free codeword are inverted from their corresponding bits of the RLL codeword.

A computer program for operating a run-length limited (RLL) encoder is executed by one or more processors. The computer program can reside on a computer readable medium such as but not limited to memory, non-volatile data storage and/or other suitable tangible storage mediums. The computer program includes receiving a data block, generating coding bits that A computer program for operating a run-length limited (RLL) receiver is executed by one or more processors. The computer program can reside on a computer readable medium such as but not limited to memory, non-volatile data storage and/or other suitable tangible storage mediums. The computer program includes receiving a predetermined portion of an RLL codeword that includes a plurality of portions and generating coding bits based on the predetermined portion. The coding bits indicate whether corresponding portions of the RLL codeword decode to one of all ones and all zeros. The computer program also includes generating a decoded data block based on the RLL codeword and the coding bits. Portions of the decoded data block correlate with portions of the RLL codeword and at least one of the portions of the RLL codeword is populated with the bits of the portion of the data block that corresponds with the predetermined portion of the RLL codeword.

In other features the RLL codeword is encoded in a non-return to zero (NRZ) format. Each portion of the RLL codeword includes at least one transition. The predetermined portion of the RLL codeword includes an additional bit when compared to a number of bits in the corresponding portion of the received data block. The plurality of portions of the RLL codeword includes first and fifth portions that each include five bits, second and fourth portions that each include six bits, and a third portion that includes seven bits. The third portion is the predetermined portion of the RLL codeword. The received data block includes 28 bits. The first through fifth portions are consecutive, the first portion includes least significant bits of the RLL codeword, and fifth portion includes most significant bits of the RLL codeword, and the third portion includes middle bits of the RLL codeword.

In other features the computer program further includes generating the RLL codewords based on received codewords. A computer program of operating a network physical layer module (PHY) includes the computer program and further includes generating the RLL codewords based on received codewords. The computer program further includes monitoring a predetermined bit in the received codewords and generating the corresponding RLL codewords by selectively inverting bits of the received codewords based on the predetermined bit. Consecutive ones of the received codewords include respective portions of a predetermined sync word. The computer program includes synchronizing with the received codewords based on the sync word. The computer program includes XORing consecutive bits of the received codewords to locate the sync word.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is data diagram of a run-length limited (RLL) codeword;

FIG. 5 is an encoding table for generating a middle portion of an RLL codeword;

FIG. 6 is an encoding table for generating outer portions of the RLL codeword;

FIG. 7 is a decoding table for the middle portion of an RLL codeword;

FIG. 8 is a decoding table for the outer portions of the RLL codeword;

FIG. 9A is a table of Boolean equations for generating intermediate variables that are used to generate the RLL codeword;

FIG. 9B is a table of Boolean equations for generating the RLL codeword;

FIG. 10A is a table of Boolean equations for generating intermediate variables that are used to decode the RLL codeword;

FIG. 10B is a table of Boolean equations for decoding the RLL codeword;

FIG. 11A is a flowchart of a method of generating a DC-free codeword;

FIG. 11B is a logic table for generating a DC-free codeword;

FIG. 12 is a flowchart of a method for updating a cumulative digital sum of DC-free codewords when a sync word is transmitted;

DETAILED DESCRIPTION

Figure 1:
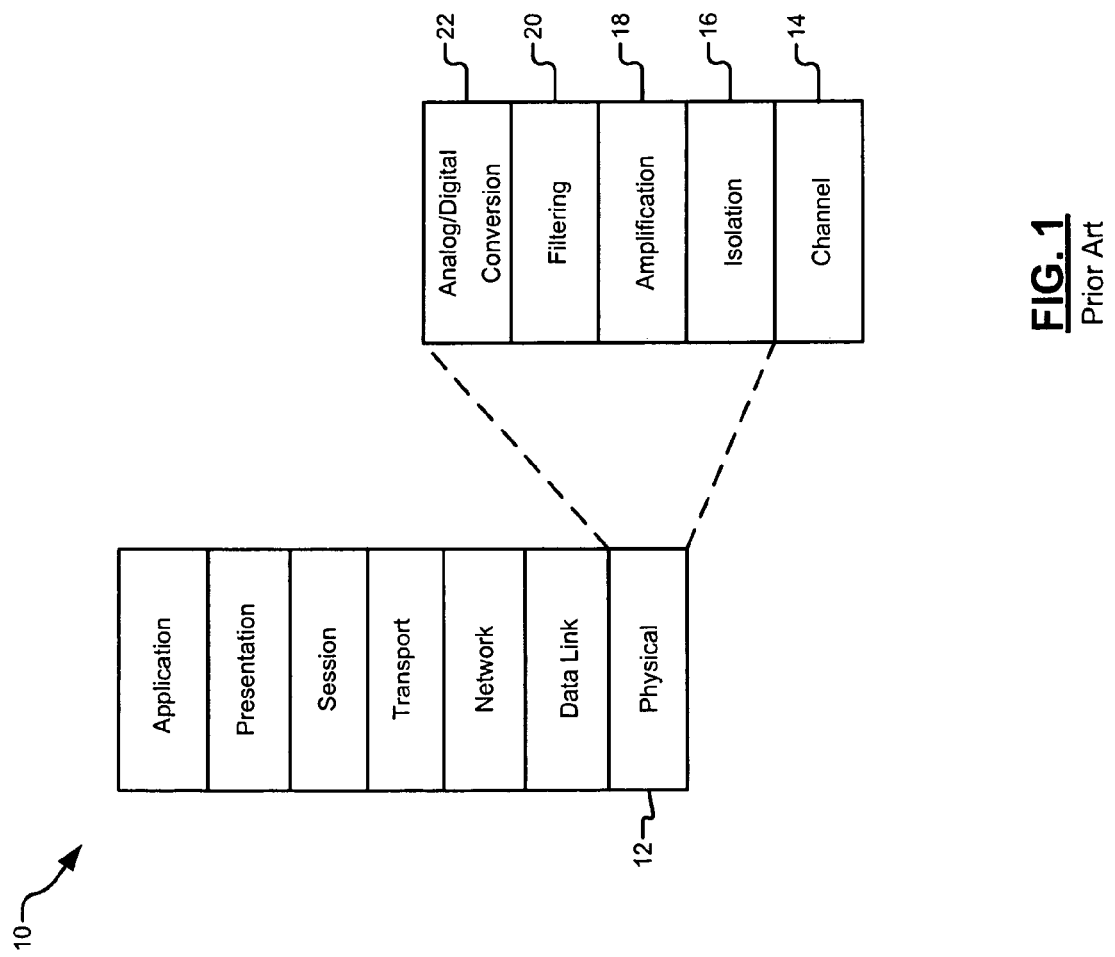
FIG. 1 is a functional block diagram of a computer network interface according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

OVERVIEW

Figure 2:
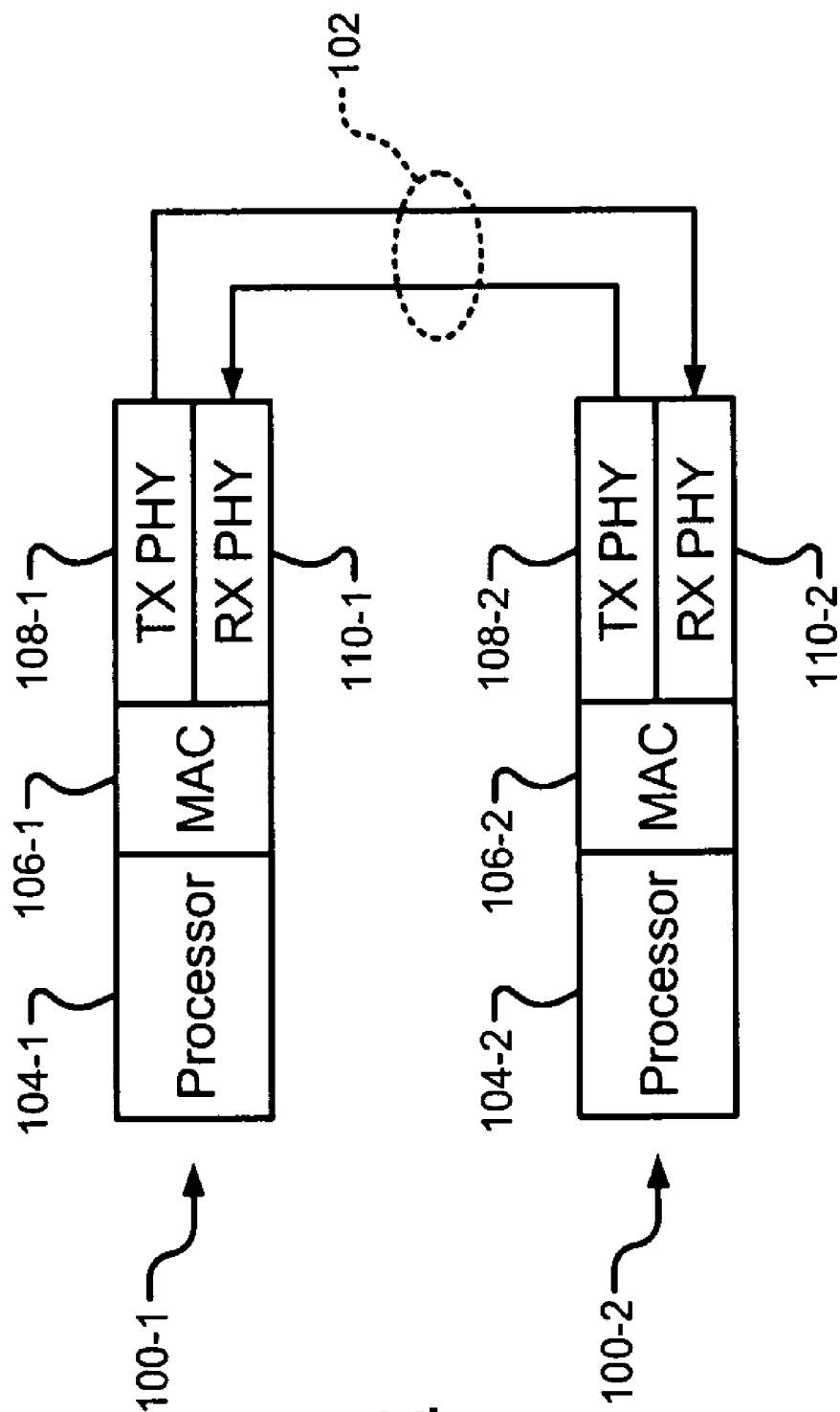
FIG. 2 is a functional block diagram of networked computers.

Referring now to FIG. 2, a functional block diagram is shown of a first computing host 100-1 and a second computing host 100-2, which are collectively referred to as hosts 100. Hosts 100 communicate with each other via a communication channel 102. In some embodiments channel 102 is a digital subscriber line (DSL), however other types of wired or wireless channels 102 may also be employed. Each host 100 includes a respective processor 104, a MAC 106, a transmit physical layer module (TX PHY) 108, and a receive physical layer module (RX PHY) 110. Transmit physical layer module (TX PHY) 108 and receive physical layer module (RX PHY) 110 can be combined to form a physical-layer transceiver module.

Processors 104 send and receive data. Each MAC 106 forms packets based on the data that is being sent from its respective processor 104. Each MAC 106 also unpacks data from packets that are received from channel 102 and then communicates the unpacked data to its respective receiving processor 104.

Figure 3:
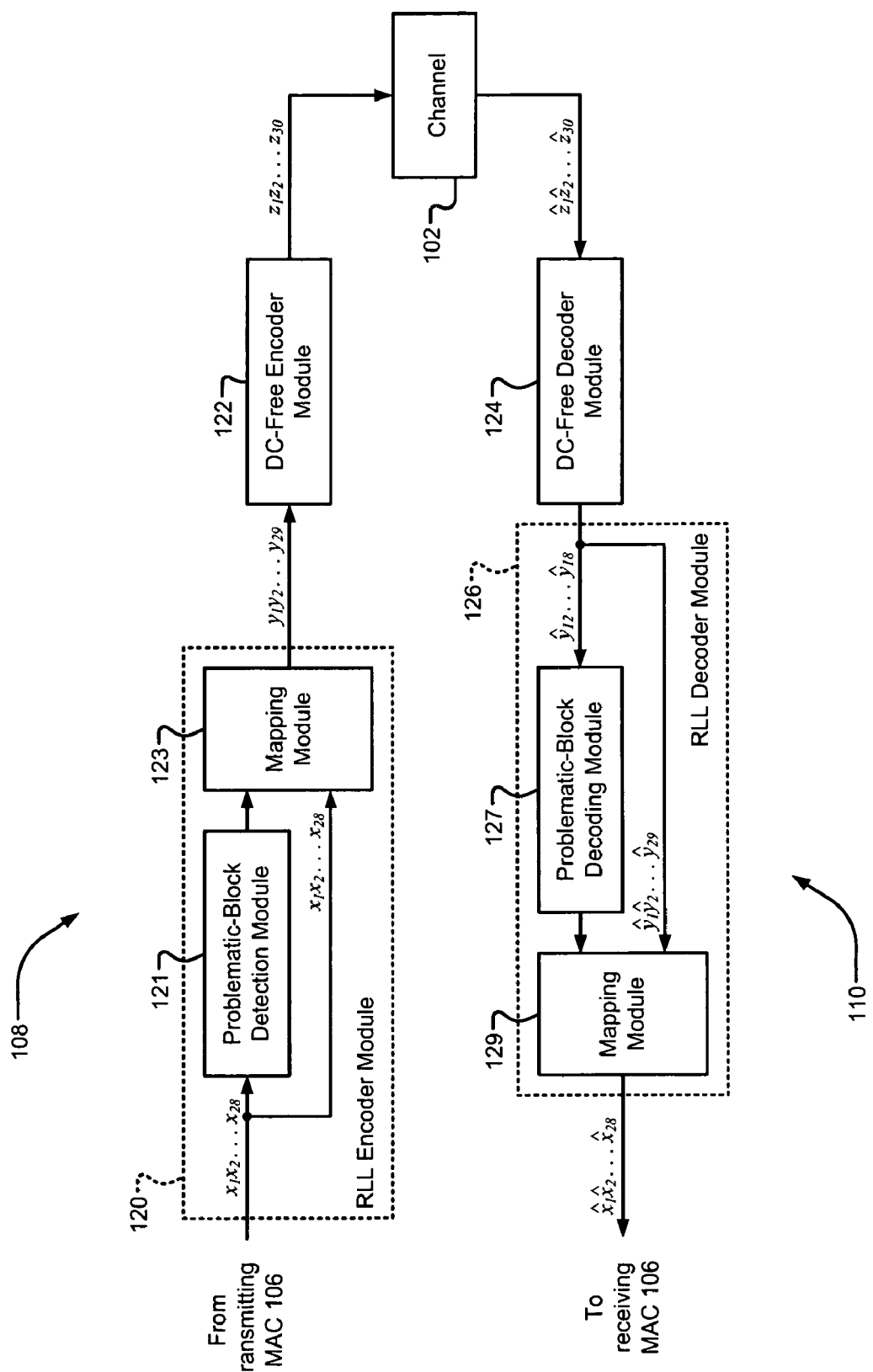
FIG. 3 is a functional block diagram of network physical layers.

Referring now to FIG. 3, functional block diagrams are shown of TX PHY 108 and RX PHY 110. TX PHY 108 includes a run-length limited (RLL) encoder module 120 and a direct-current free (DC-free) encoder module 122. RLL encoder module 120 and DC-free encoder module 122 encode data in a manner that prevents a DC-bias from developing in channel 102. DC bias reduces a dynamic range of channel 102 and can therefore reduce the bandwidth of channel 102.

RLL encoder module 120 includes a problematic-block detection module 121 and a mapping module 123 that receive 28-bit data blocks x. The 28 bits within each data block x are denoted as $x_1, x_2, \ldots, x_{28}$. RLL encoder module 120 employs a method that is described below to generate 29-bit RLL codewords y based on respective ones of the data blocks x. Each codeword y is guaranteed to have a limited number of consecutive 1's or 0's.

DC-free encoder module 122 employs a method that is described below to generate 30-bit codewords z based on a number of ones in the respective RLL codewords y. DC-free encoder module 122 bounds a running digital sum of the codewords z, which are transmitted over channel 102, and thereby ensures that the codewords z do not contribute to a DC bias in channel 102.

RX PHY 110 includes a DC-free decoder module 124 and an RLL decoder module 126. DC-free decoder module 124 receives codewords z from channel 102 and employs a method that is described below to generate received codewords ŷ. RLL decoder module 126 includes a problematic-block decoding module 127 and a mapping module 129 that receive codewords ŷ. Mapping module 129 generates received data blocks x̂ based on methods that are described below. The received data blocks x̂ are then communicated to the receiving MAC 106. DC-free decoder module 124 and RLL decoder module 126 are block decoders. Error propagation is therefore limited to one block (28 bits).

28/30 DC-Free RLL Code

Details of the RLL code and DC-free code that are employed by RLL encoder module 120 and DC-free encoder module 122, respectively, will now be described. The RLL code and DC-free code cooperate to provide a rate-28/30 DC-free RLL code with a maximum run-length of 9 (i.e. the k constraint is 8). The 28/30 DC-free RLL code assures at least 5 transitions per 30-bit codeword and a digital sum variation of at most 63. Hence, the 28/30 DC-free RLL code is DC free. Each codeword z has at least one transition in each of the following portions: $z_1 \ldots z_6, z_7 \ldots z_{12}, z_{13} \ldots z_{19}, z_{20} \ldots z_{25}$, and $z_{26} \ldots z_{30}$.

RLL encoder module 120 implements a rate-28/29 RLL code and DC-free encoder module 122 implements a rate-29/30 DC-free code. The 28/29 RLL code is run length constrained and employs a non-return to zero (NRZ) encoding/decoding process. The DC-free code is a polarity bit code.

The following notations are used in the descriptions of the RLL code and/or DC-free code. The Hamming weight of a binary word w, denoted by H(w), is the number of 1's in w. The digital sum of the binary word w, denoted by DS(w), is defined as the number of 1's in w minus the number of 0's in w. Note that DS(w)=2H(w)−|w|, where |w| is the length of the binary word w. The digital sum variation (DSV) of the binary word w is defined as $$\max_i DS(w_i^1) - \min_i DS(w_i^1) + 1,$$

where $w_i^1$ is the prefix length i of w. The DSV can be defined for a right infinite sequence as well. An infinite sequence is DC-free if its DSV is bounded.

Note that if an infinite sequence has a finite DSV N then its spectrum has a null at DC with the cutoff frequency $\omega_0$ satisfying $$\frac{1}{2\sqrt{2(1-\cos(\omega_0))}} \leq \frac{1}{12}(N+1)^2 - \frac{1}{2\sin^2\frac{\pi}{N+1}} + \frac{1}{6}.$$

For an ensemble of maxentropic sequences, the above equation becomes an equality with both sides being the sum variance. As an example, with N=63 the 28/30 DC-free RLL code has cutoff frequency $\omega_0$=0.0037. If the transmission rate is, by example, 1 GHz and a high-pass filter is used, then the high-pass cutoff must be much smaller than 1000×2×0.0037=7.4 MHz to limit signal distortion.

The RLL code that is employed by RLL encoder module 120 is a block code. In other words, RLL encoder module 120 and RLL decoder module 126 are state independent. To guarantee that the run-length at the codeword boundary is at most 8, each codeword may not start or end with 00000 or 11111. The run-length within a codeword also must not exceed 9.

The RLL code divides each 28-bit data block x into a 14-bit left portion and 14-bit right portion. The RLL code then attempts to insert a parity bit between the 14-bit left portion and the 14-bit right portion such that the parity bit creates a transition 128, such as is shown in FIG. 4. The RLL code then checks the run-length conditions that are stated in the previous paragraph. If the new 29-bit codeword y satisfies the conditions then it can be communicated to the input of DC-free encoder module 122.

If the run-length conditions are not met, then RLL encoder module 120 modifies a middle portion of the 29-bit codeword y to indicate where the run-length constraint is violated. The portion that violates the constraint is also modified to indicate the contents of the displaced data from the middle portion before it was modified. This coding scheme is best seen in the tables of FIGS. 5 and 6.

RLL Encoding

The RLL code will now be described in detail. The Boolean variables $x_1 x_2 \ldots x_{28}$ (collectively indicated by x) represent data bits at the input to problematic-block detection module 121 and mapping module 123 of RLL encoder module 120. The Boolean variables $y_1 y_2 \ldots y_{29}$ (collectively indicated by y) represent data bits at the output of mapping module 123. Problematic-block detection module 121 checks the run-length condition at four different portions of the input by verifying that none of the portions consists of all zeros or all ones. The first portion includes bits $x_1$-$x_5$, the second portion includes bits $x_6$-$x_{11}$, the third portion includes bits $x_{18}$-$x_{23}$, and the fourth portion includes bits $x_{24}$-$x_{28}$. Problematic-block detection module 121 sets four Boolean variables $L_1$, $L_2$, $R_2$, $R_1$ based on respective ones of the four run-length checks. Problematic-block detection module 121 communicates the Boolean variables $L_1, L_2, R_2, R_1$ to mapping module 123. Each Boolean variable $L_1, L_2, R_2, R_1$ is normally set to a zero but is set to a one when its corresponding portion is problematic, i.e. it contains all zeros or all ones. For example, if only the first of the four portions contains all ones or all zeroes then the Boolean variables $L_1, L_2, R_2, R_1$ are set to 1,0,0,0, respectively.

If $L_1=L_2=R_2=R_1=0$, then each of the four portions are inherently run length limited and mapping module 123 sets the output bits $y_i=x_i$ for $1 \leq i \leq 14$, sets $y_{15}=\overline{x}_{14}$, and sets $y_{i+1}=x_i$ for $15 \leq i \leq 28$.

If $L_1, L_2, R_2,$ and $R_1$ are not all zeros, then mapping module 123 computes the middle portion of the codeword, $y_{12} \ldots y_{18}$, and an intermediate variable B according to the table shown in FIG. 5. Problematic-block detection module 121 can generate B to differentiate between various combinations of locations of problematic portions.

A remainder of the output codeword is grouped into four portions: $y_1 y_2 y_3 y_4 y_5$, $y_6 y_7 y_8 y_9 y_{10} y_{11}$, $y_{19} y_{20} y_{21} y_{22} y_{23} y_{24}$, and $y_{25} y_{26} y_{27} y_{28} y_{29}$. Mapping module 123 computes the four portions based on the tables that are shown in FIG. 6 and the Boolean variables $L_1, L_2, R_2, R_1, B$ that are generated by problematic-block detection module 121. The tables of FIGS. 5 and 6 encode the problematic portion of the 28-bit data into the middle portion of the 29-bit codeword. The tables also map the middle portion, i.e. $x_{13}, x_{14},$ and $x_{15}$, of the 28-bit incoming data to the portion of the 29-bit codeword that corresponds with the problematic portion of the 28-bit incoming data.

RLL Decoding

Operation of RLL decoder module 126 will now be described. The bits at the input of RLL decoder module 126 are represented by the Boolean variables $\hat{y}_1, \hat{y}_2, \ldots \hat{y}_{29}$. The bits at the output of RLL decoder module 126 are represented by the Boolean variables $\hat{x}_1, \hat{x}_2, \ldots, \hat{x}_{28}$.

Problematic-block decoding module 129 determines whether $\hat{y}_{14} = \hat{y}_{15}$. If $\hat{y}_{14} \ne \hat{y}_{15}$, then $L_1 = L_2$ $R_2 = R_1 = 0$ and mapping module 129 generates $\hat{x}_i = \hat{y}_i$ for $1 \le i \le 14$, and $\hat{x}_i = \hat{y}_i$, for $15 \le i \le 28$.

Figures 7, 8:
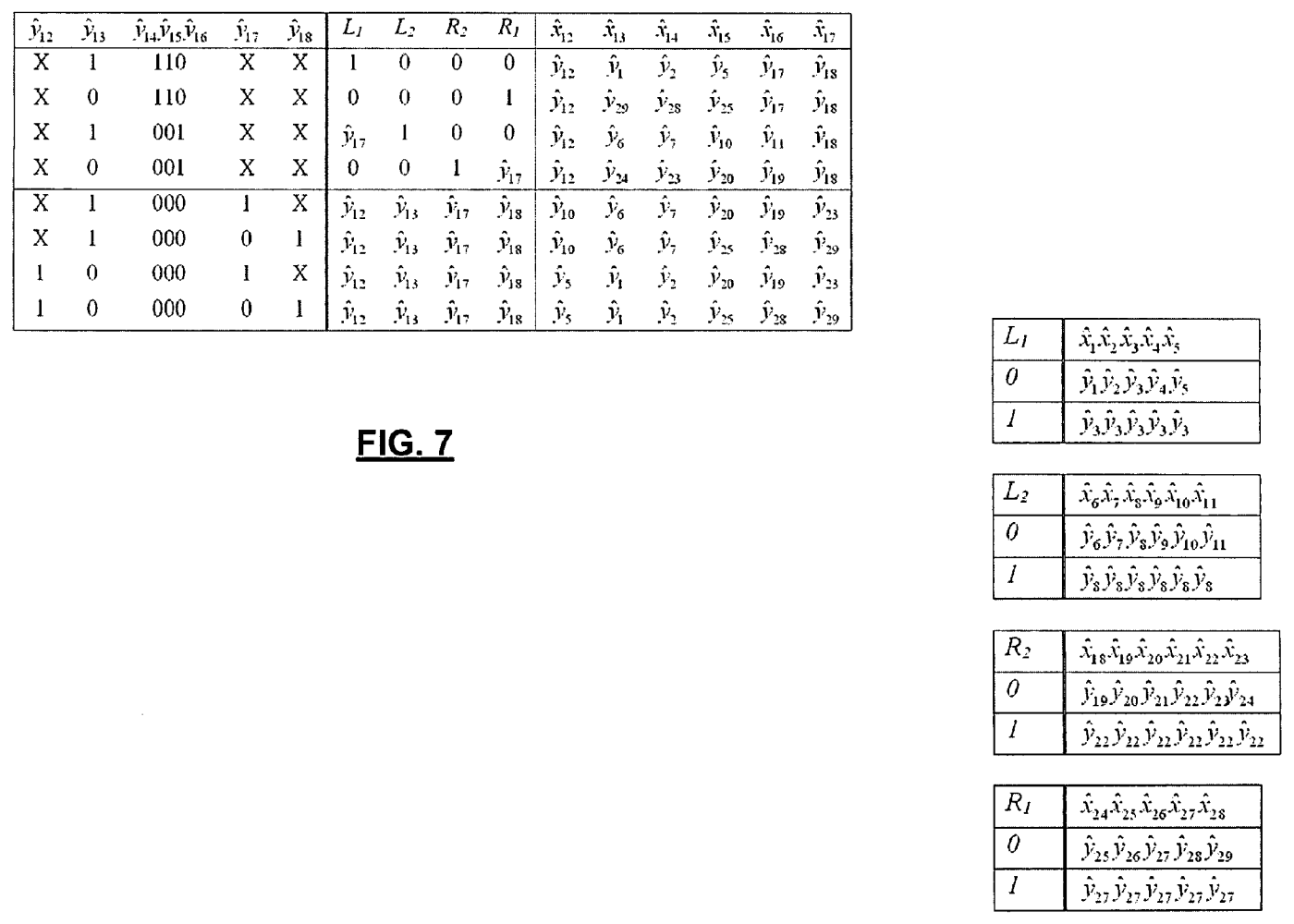

If $\hat{y}_{14} = \hat{y}_{15}$, then problematic-block decoding module 127 computes $L_1, L_2, R_2, R_1$, and $\hat{x}_{12} \ldots \hat{x}_{17}$ based on $\hat{y}_{12} \ldots \hat{y}_{18}$ as shown in the table of FIG. 7. The notation X in the table of FIG. 7 can be either 0 or 1. If $\hat{y}_{14} = \hat{y}_{15}$, and the received values of bits $\hat{y}_{12} \ldots \hat{y}_{18}$ are not listed in the table, then the received codeword is invalid. It should be appreciated that this criterion should not be used alone to check whether a received codeword is valid. After retrieving $L_1, L_2, R_2, R_1$, mapping module 129 computes the rest of the user data based on the tables shown in FIG. 8.

Boolean Equations for RLL Encoding and Decoding

Referring now to FIGS. 9A-10B, Boolean equations are shown that can be employed by RLL encoder module 120 and RLL decoder module 126. The notations •, +, and ⊕ denote the Boolean logic AND, OR, and XOR operations, respectively.

FIGS. 9A-9B show Boolean equations that can be employed by RLL encoder module 120. The Boolean equations of FIG. 9A can be implemented by problematic-block detection module 121 and express a plurality of intermediate variables that are based on the 28-bit data block x. The Boolean equations of FIG. 9B can be implemented by mapping module 123 and generate the 29-bit codeword y based on the 28-bit data block x and the intermediate variables of FIG. 9A.

FIGS. 10A-10B show Boolean equations that can be employed by RLL decoder module 126. The Boolean equations of FIG. 10A can be implemented by problematic-block decoding module 127 and generate a plurality of intermediate variables that are based on the received 29-bit codeword $\hat{y}$. The Boolean equations of FIG. 10B can be implemented by mapping module 129 and generate the received 28-bit data block $\hat{x}$ based on the received 29-bit codeword $\hat{y}$ and the intermediate variables of FIG. 1A.

DC-Free Encoding

Referring now to FIG. 11A, a flowchart is shown for a method of operating DC-free encoder module 122. The method can be restarted for each transmission of a block of codewords. Control enters block 130 and initializes a cumulative digital sum D to zero. A digital sum accumulates a sum of 1's and −1's that represent 1 and 0's, respectively, in a data block. Control then enters block 132 and processes the 29-bit codeword y in accordance with the table of FIG. 11B. The table of FIG. 11B indicates whether to flip or invert y based on the cumulative digital sum D and the digital sum DS of the 29-bit codeword y, DS(y). It should be noted that DS(y) cannot be zero since the length of y is odd. Control proceeds from block 132 to decision block 134 and determines whether y was flipped in block 132. If so, then control proceeds to block 136 and appends a 1 to $\bar{y}$ such that the 30-bit output z is $1\bar{y}$. If control determines that y was not flipped, then control branches from decision block 134 to block 140 and appends 0 to y such that the 30-bit output z is 0y. After completing the appending step of block 136 or block 140, control proceeds to block 138 and updates D based on $D \leftarrow D + DS(z)$. It should be noted that $DS(z)=1-DS(y)$ if y was flipped and $DS(z)=-1+DS(y)$ otherwise. Control proceeds from block 138 to decision block 142 and determines whether there is another codeword to transmit. If another codeword is waiting then control branches back to block 132. Otherwise control exits the method from decision block 142 and returns to other processes.

DC-Free Decoding

Operation of DC-Free decoder module 124 will now be described. DC-Free decoder module 124 checks the first bit of each incoming block $\hat{z}$. The checked bit is the bit that was appended in blocks 136 and 140 of FIG. 11A. If the checked bit is 1 then DC-Free decoder module 124 generates the decoded codeword $\hat{y}$ by flipping the other 29 bits of $\hat{z}$. If the checked bit is 0, then DC-Free decoder module 124 generates $\hat{y}$ by copying the other 29 bits of $\hat{z}$.

Synchronization

DC-free encoder module 122 may periodically insert a fixed or sync word for synchronization purposes. The sync word can be inserted at a boundary of consecutive 30-bit codewords z. The length of the sync word depends on the insertion period and how much overhead can be tolerated over channel 102. For example, if the target code rate is 7/8 including the sync word, then the 28/30 code can include two bits per block for the sync word. If the sync word insertion period is 8 blocks then the sync word can be 16 bits long. It should be appreciated by those skilled in the art that other sync word periods and lengths can also be used.

The sync word should be chosen so that it does not appear in the coded sequence. Since the maximum run-length of the coded sequence is 9, a sync word should can contain a run-length of ten bits. A possible choice is s=1000000000011010 and its inverse, $\bar{s}$.

The transmitted sync word can be selected from s and $\bar{s}$ based on the digital sum D. If $D \ge 0$, then the sync word should be s. If D<0, then the sync word should be $\bar{s}$. Selecting the sync word based on D assures that channel 102 maintains a DC-free condition through the sync word.

Referring now to FIG. 12, a method is shown for updating the digital sum D when transmitting the selected sync word. Control enters decision block 150 and determines whether the most recent sync word was s or $\bar{s}$. If it was s then control branches to block 152 and increments the cumulative digital sum D by DS(s) and then returns to other processes. If the most recent sync word was $\bar{s}$ then control branches to block 154 and decrements the cumulative digital sum D by DS(s). Control then returns to other processes.

The receiving host 100 can detect the sync word directly for both s and $\bar{s}$. Alternatively, the receiving host 100 can XOR the adjacent bits in the transmitted sequence and look for the 15-bit word z'=100000000010111 (i.e. transform the transmitted sequence z to z' by computing $z'_i = z_i \oplus z_{i-1}$ and then looking for the 15-bit word in z'.)

Figure 15:
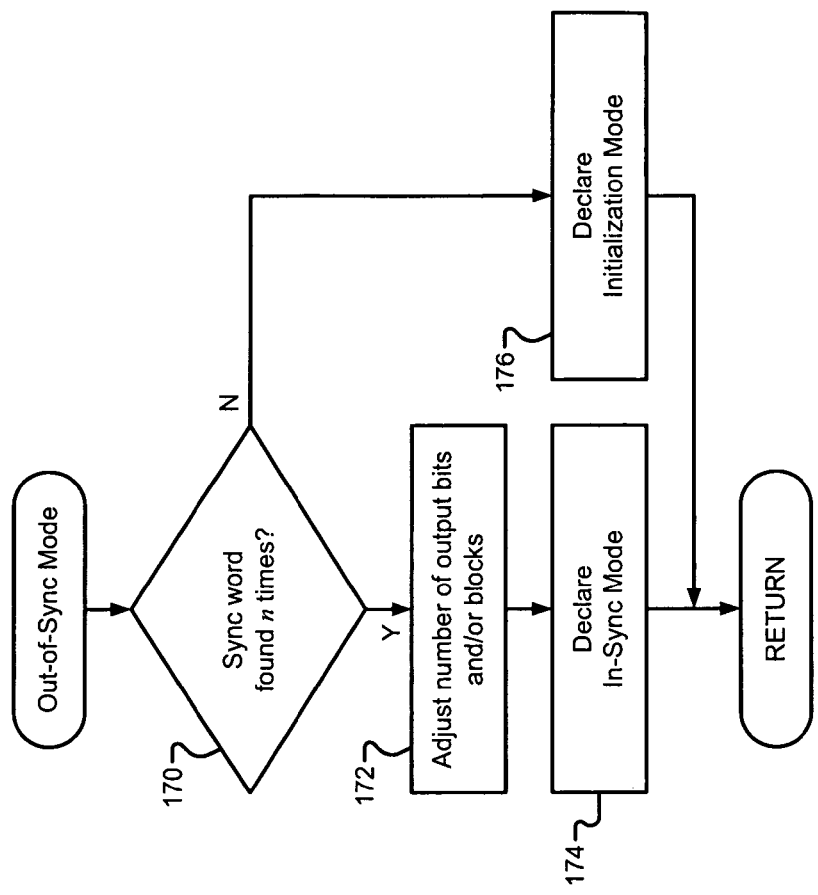
FIG. 15 is a flowchart of a method resynchronizing the physical layer receiver with received codewords.
Figure 13:
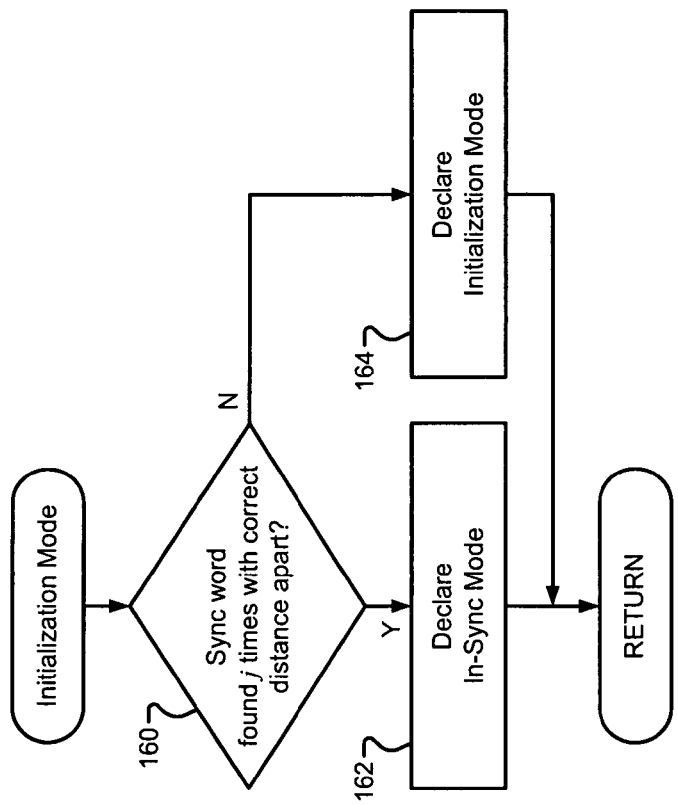
FIG. 13 is a flowchart of a method of synchronizing the physical layer receiver with received codewords.

Referring now to FIGS. 13-15, various methods are shown for initializing, verifying, and maintaining synchronization between transmitting and receiving hosts 100. The various methods are executed by the receiving host 100 and assume that the transmitting host 100 periodically transmits the sync word as described in the preceding paragraphs.

Referring now to FIG. 13, a method is shown for initializing synchronization between the transmitting and receiving hosts 100. Control enters an Initialization mode and immediately proceeds to decision block 160. In decision block 160 control determines whether the sync word has been decoded bit-by-bit a first predetermined number, j, times and with a correct period between the sync words. For example, if the first predetermined number j is equal to 6 and the insertion period is 8, then there should be 240 bits between each sync word. If these conditions are met then control branches to block 162 and declares an In-Sync mode before returning to other processes. If, in decision block 160, control determines that the conditions have not been met then control proceeds to block 164 and maintains the Initialization mode.

Figure 14B:
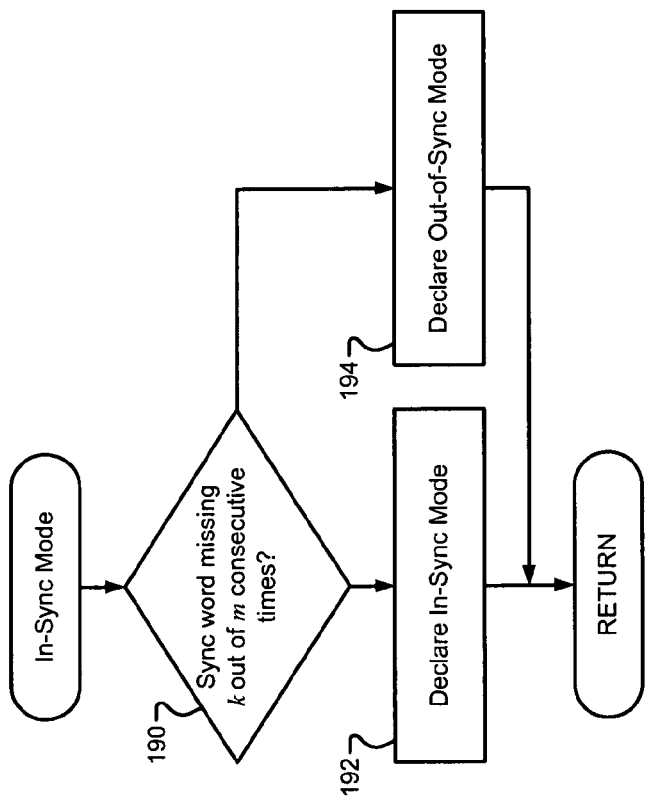
FIG. 14B is a flowchart of a second method of keeping the physical layer receiver synchronized with the received codewords.
Figure 14A:
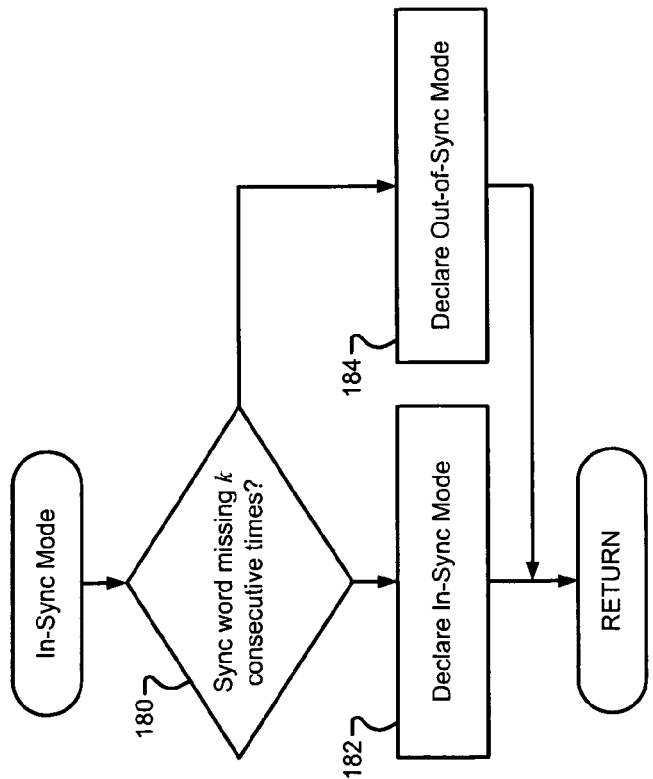
FIG. 14A is a flowchart of a first method of keeping the physical layer receiver synchronized with the received codewords.

Referring now to FIG. 14A, a first method is shown for verifying that the receiving host 100 is sync. Control executes the method when the method of FIG. 13 declares the In-sync mode. Control enters the method and immediately proceeds to decision block 180. In decision block 180 control determines whether it has found the sync word a second predetermined consecutive number, k, of times. If so, then control branches to block 182 and maintains the In-Sync mode. If not, then control branches to block 184 and declares an Out-of-Sync mode. The second predetermined number k can be chosen based on a likeliness for timing slip to occur.

Referring now to FIG. 14B, a second method is shown that verifies whether the receiving host 100 is sync. Control enters during the In-Sync mode and immediately proceeds to decision block 190. In decision block 190 control determines whether it has found the sync word second predetermined consecutive number k out of a third predetermined number, m, times. If so, then control branches to block 192 and maintains the In-Sync mode. If not, then control branches from decision block 190 to block 194 and declares an Out-of-Sync mode.

Referring now to FIG. 15, a method is shown that the receiving host 100 employs to recover from the Out-of-Sync mode. Control enters the method and immediately proceeds to decision block 170. In decision block 170 control determines whether it has found the sync word a fourth predetermined number, n, times in the vicinity of the expected sync word location. If so then control proceeds to block 172 and adjusts the number of output blocks or bits so that they contain the correct number of blocks and/or bits. Control makes the adjustment by searching for a sync word before or after a previous location and then accordingly adjusting the number of output bits and/or blocks.

Returning now to decision block 170, if control does not find the sync word the fourth predetermined number n times in the vicinity of the expected sync word location the control branches to block 176 and declares the Initialization mode.

Exemplary Implementations

Figure 16A:
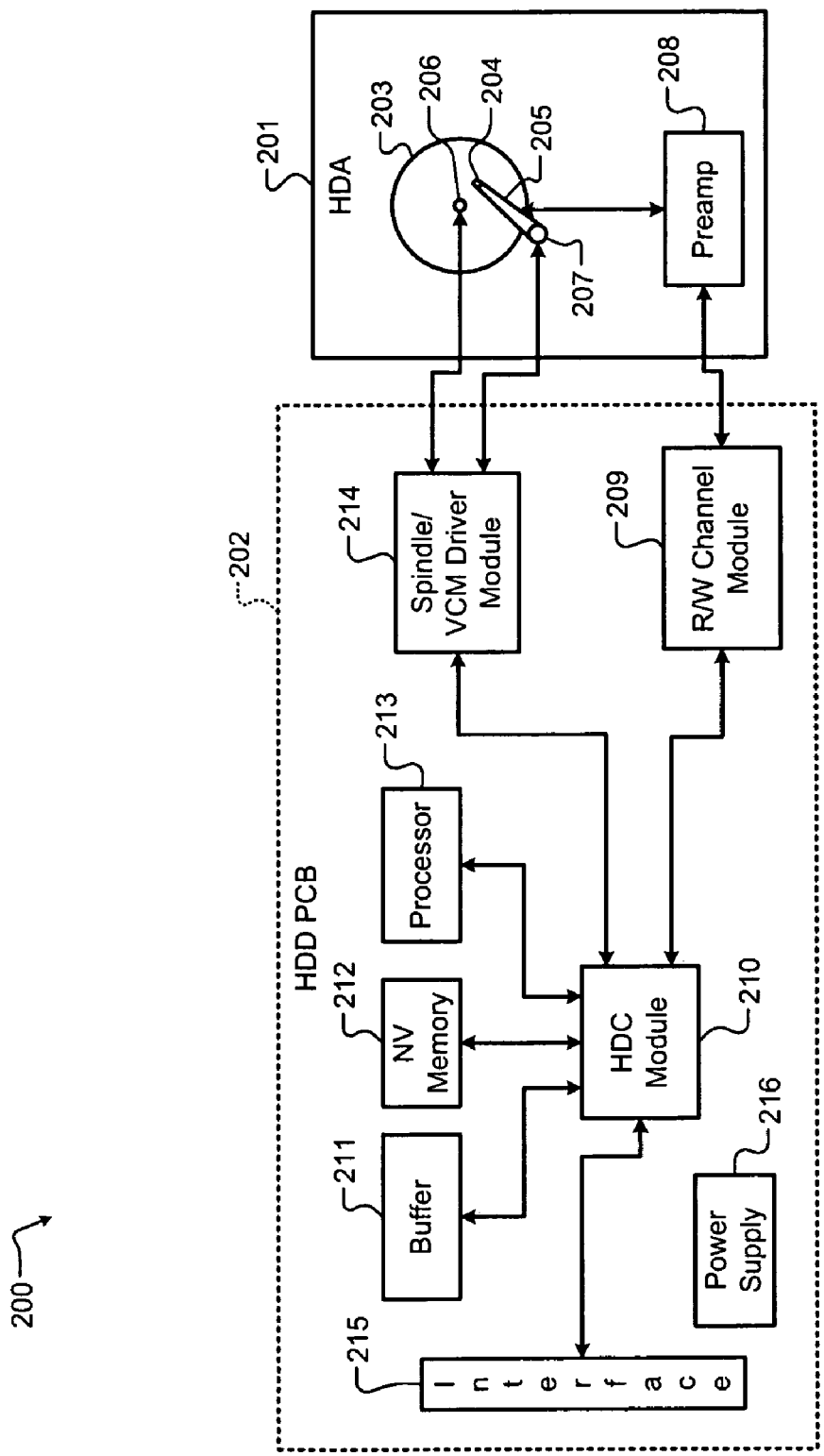
FIG. 16A is a functional block diagram of a hard disk drive.

Referring now to FIG. 16A, the teachings of the disclosure can be implemented in a read/write channel module (hereinafter, "read channel") 209 of a hard disk drive (HDD) 200. The HDD 200 includes a hard disk assembly (HDA) 201 and a HDD PCB 202. The HDA 201 may include a magnetic medium 203, such as one or more platters that store data, and a read/write device 204. The read/write device 204 may be arranged on an actuator arm 205 and may read and write data on the magnetic medium 203. Additionally, the HDA 201 includes a spindle motor 206 that rotates the magnetic medium 203 and a voice-coil motor (VCM) 207 that actuates the actuator arm 205. A preamplifier device 208 amplifies signals generated by the read/write device 204 during read operations and provides signals to the read/write device 204 during write operations.

The HDD PCB 202 includes the read channel 209, a hard disk controller (HDC) module 210, a buffer 211, nonvolatile memory 212, a processor 213, and a spindle/VCM driver module 214. The read channel 209 processes data received from and transmitted to the preamplifier device 208 in accordance with the 28/30 DC-free RLL code. The HDC module 210 controls components of the HDA 201 and communicates with an external device (not shown) via an I/O interface 215. The external device may include a computer, a multimedia device, a mobile computing device, etc. The I/O interface 215 may include wireline and/or wireless communication links.

The HDC module 210 may receive data from the HDA 201, the read channel 209, the buffer 211, nonvolatile memory 212, the processor 213, the spindle/VCM driver module 214, and/or the I/O interface 215. The processor 213 may process the data, including encoding, decoding, filtering, and/or formatting. The processed data may be output to the HDA 201, the read channel 209, the buffer 211, nonvolatile memory 212, the processor 213, the spindle/VCM driver module 214, and/or the I/O interface 215.

The HDC module 210 may use the buffer 211 and/or nonvolatile memory 212 to store data related to the control and operation of the HDD 200. The buffer 211 may include DRAM, SDRAM, etc. The nonvolatile memory 212 may include flash memory (including NAND and NOR flash memory), phase change memory, magnetic RAM, or multi-state memory, in which each memory cell has more than two states. The spindle/VCM driver module 214 controls the spindle motor 206 and the VCM 207. The HDD PCB 202 includes a power supply 216 that provides power to the components of the HDD 200.

Figure 16B:
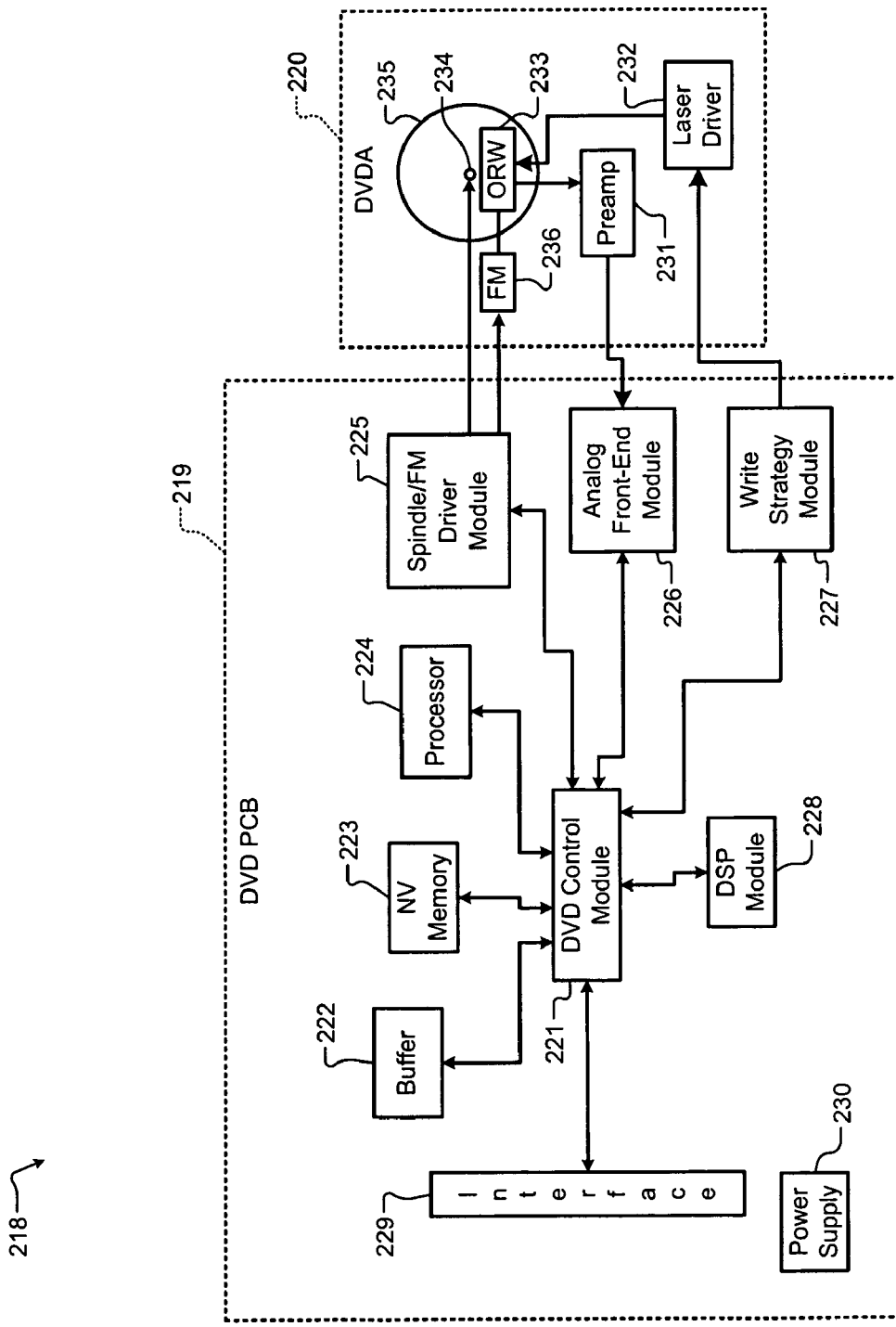
FIG. 16B is a functional block diagram of a DVD drive.

Referring now to FIG. 16B, the teachings of the disclosure can be implemented in a processor 224 of a DVD drive 218 or of a CD drive (not shown). The DVD drive 218 includes a DVD PCB 219 and a DVD assembly (DVDA) 220. The DVD PCB 219 includes a DVD control module 221, a buffer 222, nonvolatile memory 223, the processor 224, a spindle/FM (feed motor) driver module 225, an analog front-end module 226, a write strategy module 227, and a DSP module 228.

The DVD control module 221 controls components of the DVDA 220 and communicates with an external device (not shown) via an I/O interface 229. The external device may include a computer, a multimedia device, a mobile computing device, etc. The I/O interface 229 may include wireline and/or wireless communication links.

The DVD control module 221 may receive data from the buffer 222, nonvolatile memory 223, the processor 224, the spindle/FM driver module 225, the analog front-end module 226, the write strategy module 227, the DSP module 228, and/or the I/O interface 229. The processor 224 may encode and decode the data in accordance with the 28/30 DC-free RLL code. The processor 224 may also process the data, including filtering, and/or formatting. The DSP module 228 performs signal processing, such as video and/or audio coding/decoding. The processed data may be output to the buffer 222, nonvolatile memory 223, the processor 224, the spindle/FM driver module 225, the analog front-end module 226, the write strategy module 227, the DSP module 228, and/or the I/O interface 229.

The DVD control module 221 may use the buffer 222 and/or nonvolatile memory 223 to store data related to the control and operation of the DVD drive 218. The buffer 222 may include DRAM, SDRAM, etc. The nonvolatile memory 223 may include flash memory (including NAND and NOR flash memory), phase change memory, magnetic RAM, or multi-state memory, in which each memory cell has more than two states. The DVD PCB 219 includes a power supply 230 that provides power to the components of the DVD drive 218.

The DVDA 220 may include a preamplifier device 231, a laser driver 232, and an optical device 233, which may be an optical read/write (ORW) device or an optical read-only (OR) device. A spindle motor 234 rotates an optical storage medium 235, and a feed motor 236 actuates the optical device 233 relative to the optical storage medium 235.

When reading data from the optical storage medium 235, the laser driver provides a read power to the optical device 233. The optical device 233 detects data from the optical storage medium 235, and transmits the data to the preamplifier device 231. The analog front-end module 226 receives data from the preamplifier device 231 and performs such functions as filtering and A/D conversion. To write to the optical storage medium 235, the write strategy module 227 transmits power level and timing data to the laser driver 232. The laser driver 232 controls the optical device 233 to write data to the optical storage medium 235.

Figure 16D:
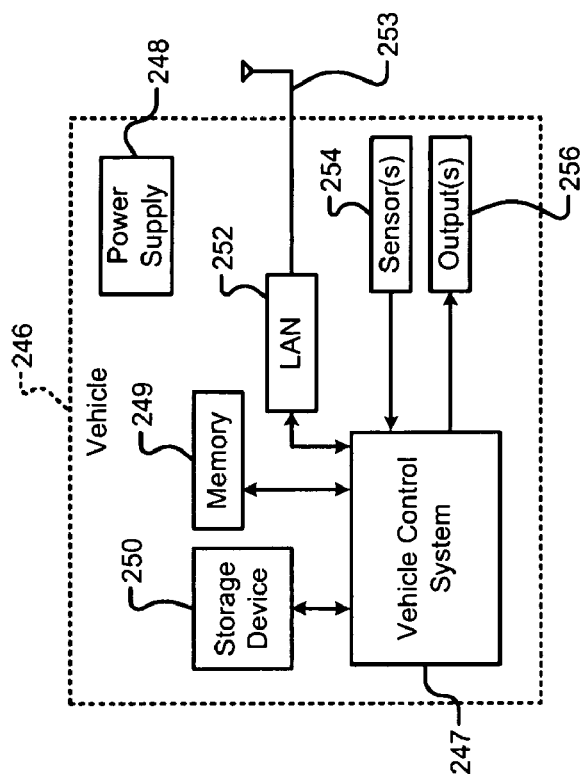
FIG. 16D is a functional block diagram of a vehicle control system.
Figure 16C:
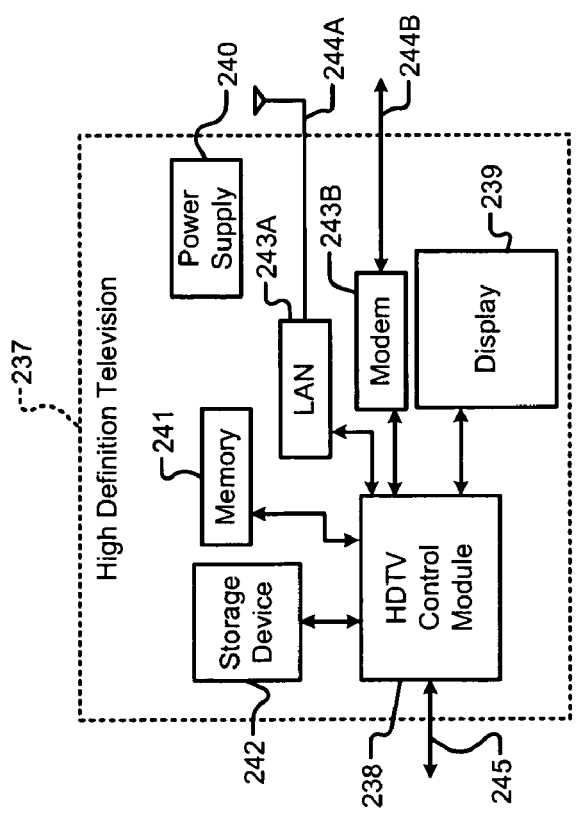
FIG. 16C is a functional block diagram of a high definition television.

Referring now to FIG. 16C, the teachings of the disclosure can be implemented in a LAN interface 243A and/or a modem 243B of a high definition television (HDTV) 237. The modem 243B can be a DSL modem or a cable modem. The HDTV 237 includes a HDTV control module 238, a display 239, a power supply 240, memory 241, a storage device 242, the LAN interface 243A and associated wired or wireless media 244A, the modem 243A, and an external interface 245. The modem 243B communicates with a telephone or cable television cable 244B.

The HDTV 237 can receive input signals from the LAN interface 243A, the modem 243B and/or the external interface 245, which send and receive information via cable, wired or wireless broadband Internet, and/or satellite. The HDTV control module 238 may process the input signals, including encoding, decoding, filtering, and/or formatting, and generate output signals. The output signals may be communicated to one or more of the display 239, memory 241, the storage device 242, the LAN interface 243A, the modem 243B, and the external interface 245.

Memory 241 may include random access memory (RAM) and/or nonvolatile memory such as flash memory, phase change memory, or multi-state memory, in which each memory cell has more than two states. The storage device 242 may include an optical storage drive, such as a DVD drive, and/or a hard disk drive (HDD). The HDTV control module 238 communicates externally via the LAN interface 243A, the modem 243B, and/or the external interface 245. The power supply 240 provides power to the components of the HDTV 237.

Referring now to FIG. 16D, the teachings of the disclosure may be implemented in a LAN interface 252 of a vehicle 246. The vehicle 246 may include a vehicle control system 247, a power supply 248, memory 249, a storage device 250, and the LAN interface 252. The LAN interface 252 may be wired and/or wireless and can include an antenna 253. The vehicle control system 247 may be a powertrain control system, a body control system, an entertainment control system, an anti-lock braking system (ABS), a navigation system, a telematics system, a lane departure system, an adaptive cruise control system, and the like.

The vehicle control system 247 may communicate with one or more sensors 254 and generate one or more output signals 256. The sensors 254 may include temperature sensors, acceleration sensors, pressure sensors, rotational sensors, airflow sensors, etc. The output signals 256 may control engine operating parameters, transmission operating parameters, suspension parameters, etc.

The power supply 248 provides power to the components of the vehicle 246. The vehicle control system 247 may store data in memory 249 and/or the storage device 250. Memory 249 may include random access memory (RAM) and/or nonvolatile memory such as flash memory, phase change memory, or multi-state memory, in which each memory cell has more than two states. The storage device 250 may include an optical storage drive, such as a DVD drive, and/or a hard disk drive (HDD). The vehicle control system 247 may use the LAN interface 252 to communicate with other vehicles and/or land-based communications infrastructure.

Figure 16F:
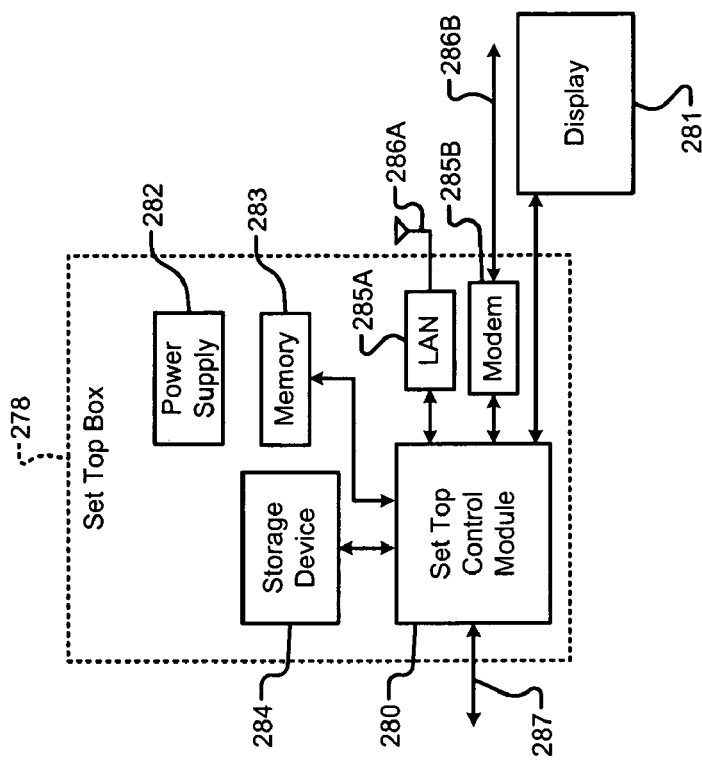
FIG. 16F is a functional block diagram of a set top box.
Figure 16E:
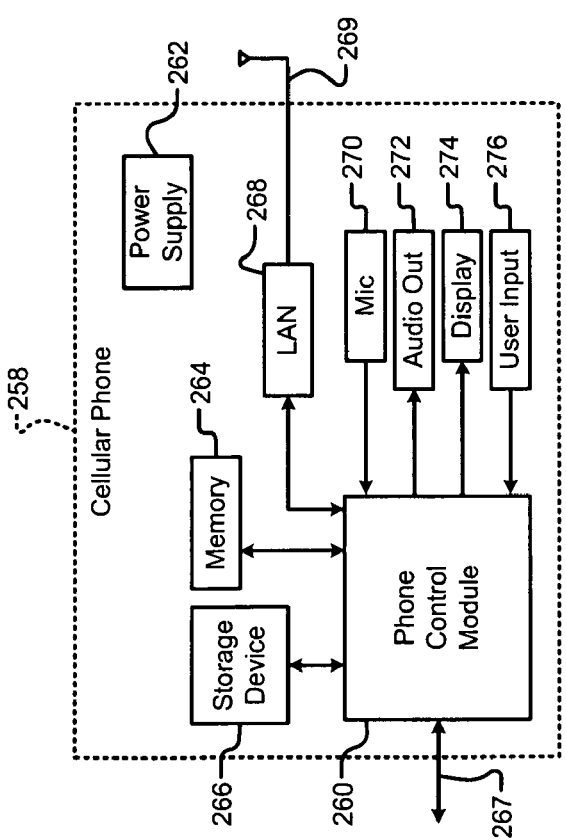
FIG. 16E is a functional block diagram of a cellular phone.

Referring now to FIG. 16E, the teachings of the disclosure can be implemented in a LAN interface 268 of a cellular phone 258. The cellular phone 258 includes a phone control module 260, a power supply 262, memory 264, a storage device 266, a cellular network interface 267, the LAN interface 268, a microphone 270, an audio output 272 such as a speaker and/or output jack, a display 274, and a user input device 276 such as a keypad and/or pointing device. The LAN interface 268 may communicate over wired media and wireless media with an associated antenna 269.

The phone control module 260 may receive input signals from the cellular network interface 267, the LAN interface 268, the microphone 270, and/or the user input device 276. The phone control module 260 may process signals, including encoding, decoding, filtering, and/or formatting, and generate output signals. The output signals may be communicated to one or more of memory 264, the storage device 266, the cellular network interface 267, the LAN interface 268, and the audio output 272.

Memory 264 may include random access memory (RAM) and/or nonvolatile memory such as flash memory, phase change memory, or multi-state memory, in which each memory cell has more than two states. The storage device 266 may include an optical storage drive, such as a DVD drive, and/or a hard disk drive (HDD). The power supply 262 provides power to the components of the cellular phone 258.

Referring now to FIG. 16F, the teachings of the disclosure can be implemented in a LAN interface 285A and/or a modem 285B of a set top box 278. The modem 285B can be a DSL modem or a cable modem. The set top box 278 includes a set top control module 280, a display 281, a power supply 282, memory 283, a storage device 284, the LAN interface 285A and the modem 285B. The LAN interface 285A may communicate over wired media and wireless media with an associated antenna 286A. The modem 285B may communicate over a telephone or cable television cable 286B.

The set top control module 280 may receive input signals from the LAN interface 285 and an external interface 287, which can send and receive information via cable, broadband Internet, and/or satellite. The set top control module 280 may process signals, including encoding, decoding, filtering, and/or formatting, and generate output signals. The output signals may include audio and/or video signals in standard and/or high definition formats. The output signals may be communicated to the LAN interface 285A, the modem 285B, and/or to the display 281. The display 281 may include a television, a projector, and/or a monitor.

The power supply 282 provides power to the components of the set top box 278. Memory 283 may include random access memory (RAM) and/or nonvolatile memory such as flash memory, phase change memory, or multi-state memory, in which each memory cell has more than two states. The storage device 284 may include an optical storage drive, such as a DVD drive, and/or a hard disk drive (HDD).

Figure 16G:
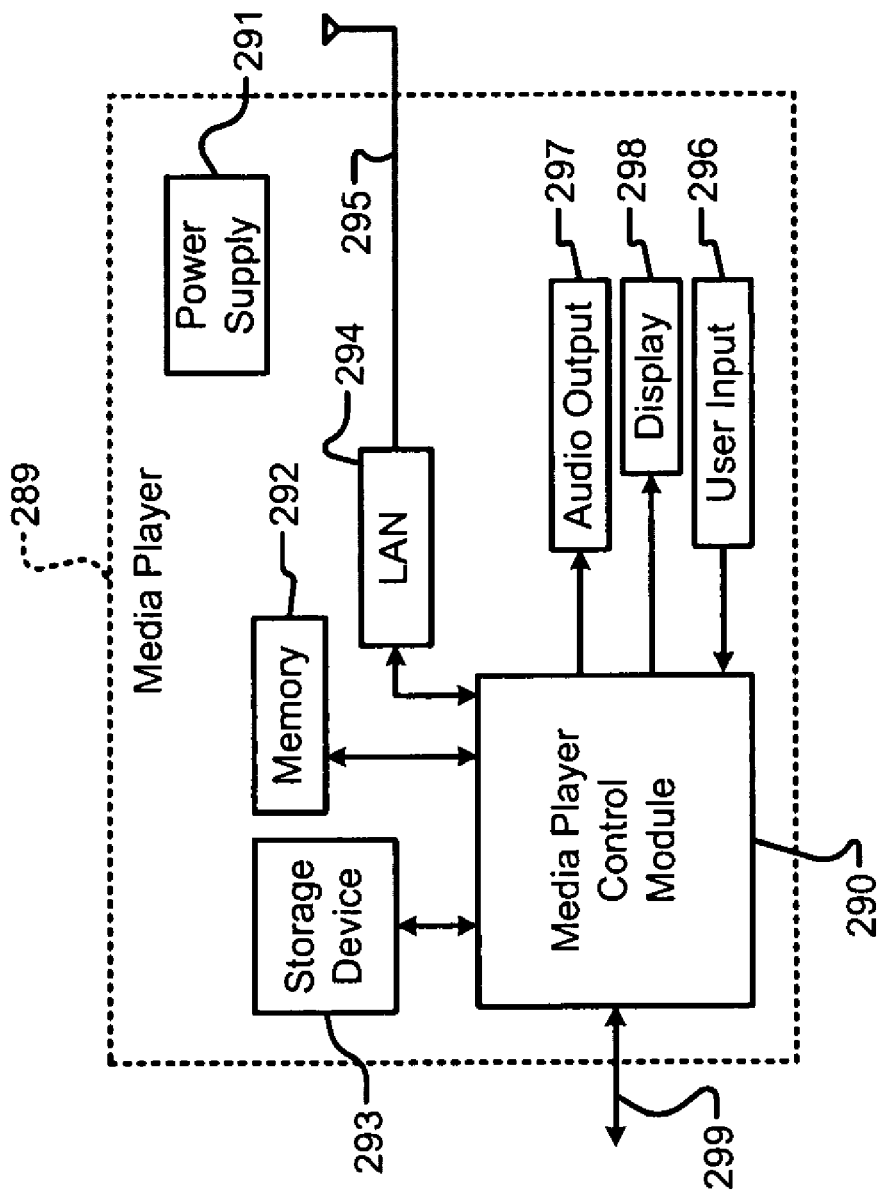
FIG. 16G is a functional block diagram of a mobile device.

Referring now to FIG. 16G, the teachings of the disclosure can be implemented in a LAN interface 294 of a mobile device 289. The mobile device 289 may include a mobile device control module 290, a power supply 291, memory 292, a storage device 293, the LAN interface 294, and an external interface 299. The LAN interface 294 may communicate over wired media and over wireless media with an associated antenna 295.

The mobile device control module 290 may receive input signals from the LAN interface 294 and/or the external interface 299. The external interface 299 may include USB, infrared, and/or Ethernet. The input signals may include compressed audio and/or video, and may be compliant with the MP3 format. Additionally, the mobile device control module 290 may receive input from a user input 296 such as a keypad, touchpad, or individual buttons. The mobile device control module 290 may process input signals, including encoding, decoding, filtering, and/or formatting, and generate output signals.

The mobile device control module 290 may output audio signals to an audio output 297 and video signals to a display 298. The audio output 297 may include a speaker and/or an output jack. The display 298 may present a graphical user interface, which may include menus, icons, etc. The power supply 291 provides power to the components of the mobile device 289. Memory 292 may include random access memory (RAM) and/or nonvolatile memory such as flash memory, phase change memory, or multi-state memory, in which each memory cell has more than two states. The storage device 293 may include an optical storage drive, such as a DVD drive, and/or a hard disk drive (HDD). The mobile device may include a personal digital assistant, a media player, a gaming console or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A run-length limited (RLL) encoder, comprising:
    a block detection module that receives a data block that includes N portions and that generates N−1 coding bits that indicate whether corresponding ones of N−1 of the N portions of the data block include one of all ones and all zeros, where N is an integer greater than two; and
    a mapping module that generates an RLL codeword including N portions comprising bits that are determined by a first mapping table, a second mapping table, bits of the data block and the N−1 coding bits.

2. The RLL encoder of claim 1 wherein the first mapping table generates one of the N portions of the RLL codeword based the N−1 coding bits and at least two bits of a remaining one of the N portions of the data block.

3. The RLL encoder of claim 1 wherein the first mapping table generates an intermediate coding bit.

4. The RLL encoder of claim 3 wherein the second table generates N−1 of the N portions of the RLL codeword based on at least N−1 of the N portions of the data block, the intermediate coding bit and the N−1 coding bits.

5. The RLL encoder of claim 1 wherein the RLL codeword is encoded in a non-return to zero (NRZ) format.

6. The RLL encoder of the claim 1 wherein each of the N portions of the RLL codeword includes at least one transition.

7. The RLL encoder of claim 1 wherein one of the N portions of the RLL codeword includes an additional bit as compared to a corresponding one of the N portions of the data block.

8. The RLL encoder of claim 1 wherein the N portions of the RLL codeword include first and fifth portions that each include five bits, second and fourth portions that each include six bits, and a third portion that includes seven bits.

9. A DC-free encoder module comprising the RLL encoder of claim 1, wherein the DC-free encoder module generates DC-free codewords based on one of the RLL codewords, a cumulative digital sum of previously-generated DC-free codewords and an appended bit, and wherein the appended bit indicates whether remaining bits of the DC-free codeword are inverted from their corresponding bits of the RLL codeword.

10. A method for providing a run-length limited (RLL) encoder, comprising:
    receiving a data block that includes N portions;
    generating N−1 coding bits that indicate whether corresponding ones of N−1 portions of the data block include one of all ones and all zeros, where N is an integer greater than two; and
    generating an RLL codeword including N portions comprising bits that are determined by a first mapping operation, a second mapping operation, bits of the data block and the N−1 coding bits.

11. The method of claim 10 wherein the first mapping operation includes generating one of the N portions of the RLL codeword based the N−1 coding bits and at least two bits of a remaining one of the N portions of the data block.

12. The method of claim 10 wherein the first mapping table generates an intermediate coding bit.

13. The method of claim 12 wherein the second table operation includes generating N−1 of the N portions of the RLL codeword based on at least N−1 of the N portions of the data block, the intermediate coding bit and the N−1 coding bits.

14. The method of claim 10 further comprising encoding the RLL codeword in a non-return to zero (NRZ) format.

15. The method of the claim 10 wherein each of the N portions of the RLL codeword includes at least one transition.

16. The method of claim 10 wherein one of the N portions of the RLL codeword includes an additional bit as compared to a corresponding one of the N portions of the data block.

17. The method of claim 10 wherein the N portions of the RLL codeword include first and fifth portions that each include five bits, second and fourth portions that each include six bits, and a third portion that includes seven bits.

18. The method of claim 10 further comprising:
    generating DC-free codewords based on one of the RLL codewords, a cumulative digital sum of previously-generated DC-free codewords and an appended bit,
    wherein the appended bit indicates whether remaining bits of the DC-free codeword are inverted from their corresponding bits of the RLL codeword.

* * * * *